(12) United States Patent
Yamada et al.

(10) Patent No.: US 6,500,535 B1
(45) Date of Patent: *Dec. 31, 2002

(54) HEAT RESISTANT, LOW DIELECTRIC POLYMERS, AND FILMS, SUBSTRATES, ELECTRONIC PARTS AND HEAT RESISTANT RESIN MOLDED PARTS USING THE SAME

(75) Inventors: Toshiaki Yamada, Saitama (JP); Takeshi Takahashi, Chiba (JP); Yoshiyuki Yasukawa, Chiba (JP); Kenji Endou, Chiba (JP); Shigeru Asami, Chiba (JP); Michihisa Yamada, Aichi (JP); Yasuo Moriya, Tokyo (JP)

(73) Assignees: TDK Corporation, Tokyo (JP); NOF Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,533

(22) Filed: Aug. 26, 1998

(30) Foreign Application Priority Data

Aug. 27, 1997 (JP) .............................. 9-246052

(51) Int. Cl.$^7$ .............................. B32B 27/32; B32B 5/16

(52) U.S. Cl. ...................... 428/327; 428/517; 428/519; 428/516; 525/241; 525/315; 525/323; 525/324; 525/240

(58) Field of Search ............................. 525/55, 63, 64, 525/69–71, 88–90, 95, 931, 250, 268, 288, 289, 309, 172, 313, 314, 240, 241, 323, 324; 428/220, 332, 337, 338, 339, 500, 515, 327

(56) References Cited

U.S. PATENT DOCUMENTS

| | | | | |
|---|---|---|---|---|
| 4,423,190 A | * | 12/1983 | Fukawa et al. | 525/98 |
| 4,983,663 A | | 1/1991 | Orikasa et al. | |
| 5,036,120 A | | 7/1991 | Orikasa et al. | |
| 5,037,890 A | * | 8/1991 | Yokoyama et al. | 525/250 |
| 5,166,240 A | | 11/1992 | Sakazume et al. | |
| 5,175,204 A | | 12/1992 | Orikasa et al. | |
| 5,204,405 A | | 4/1993 | Orikasa et al. | |
| 5,212,227 A | | 5/1993 | Sakazume et al. | |
| 5,218,037 A | | 6/1993 | Orikasa et al. | |
| 5,332,788 A | * | 7/1994 | Yokoyama et al. | 525/250 |
| 5,397,842 A | * | 3/1995 | Hamilton et al. | 525/263 |
| 5,717,035 A | * | 2/1998 | Coolbaugh et al. | 525/314 |
| 5,814,702 A | * | 9/1998 | Avakian et al. | 525/71 |

FOREIGN PATENT DOCUMENTS

| | | |
|---|---|---|
| JP | 61-98714 | 5/1986 |
| JP | 61-258848 | 11/1986 |
| JP | 1-168741 | 7/1989 |
| JP | 3-162429 | 7/1991 |
| JP | 5-179077 | 7/1993 |
| JP | 6-228377 | 8/1994 |
| JP | 8-20681 | 1/1996 |
| JP | 8-269137 | 10/1996 |

* cited by examiner

Primary Examiner—D. Lawrence Tarazano
(74) Attorney, Agent, or Firm—Oblon, Spivak, McClelland, Maier & Neustadt, P.C.

(57) ABSTRACT

The invention provides a heat-resistant, low-dielectric polymeric material that is preferably a copolymer in which a non-polar α-olefin base polymer segment and a vinyl aromatic copolymer segment are chemically combined with each other, and that is a thermoplastic resin showing a multi-phase structure in which a dispersion phase formed by one segment is finely dispersed in a continuous phase formed by another segment. It is thus possible to achieve a polymeric material that is excellent in heat resistance, has high strength, and has a low dielectric constant and a reduced dielectric loss, and so is suitable for an electrical insulating material for high-frequency purposes.

21 Claims, 4 Drawing Sheets

(× 10.000)

(x 10.000)

HEAT RESISTANT, LOW DIELECTRIC POLYMERS, AND FILMS, SUBSTRATES, ELECTRONIC PARTS AND HEAT RESISTANT RESIN MOLDED PARTS USING THE SAME

BACKGROUND OF THE INVENTION

1. Art Field

The present invention relates generally to a novel heat-resistant, low-dielectric polymeric material, and films, substrates, electronic parts and heat-resistant resin formed articles obtained by use of the same. Specifically, the present invention is concerned with a low-dielectric-constant polymeric material that has a low dielectric constant and a low dielectric loss tangent, is excellent in heat resistance in a high-temperature range and close contact with or adhesion to metals and metal foils as well, and is capable of injection molding, press molding, transfer molding and extrusion molding. More specifically, the present invention is directed to a substrate or the like that is prepared by thermal fusion and lamination of films obtainable from the low-dielectric-constant polymeric material itself.

2. Background Art

To meet recent sharp increases in the quantity of information communications, there are growing demands for size and weight reductions, and fast operation of communications equipment and, hence, low-dielectric electrical insulating materials capable of meeting such demands are now in urgent need. In particular, the frequencies of radio waves used for hand-portable mobile communications such as earphones and digital portable phones, and satellite communications are in high-frequency bands covering from the MHz to GHz bands. Size reductions, and high-density packing of housings, substrates and elements are attempted on account of the rapid progress of communications equipment used as these communications means. For achieving size and weight reductions of communications equipment used in the high-frequency band region covering from the MHz to GHz bands, it is now required to develop an electrical insulating material with excellent high-frequency transmission characteristics combined with suitable low dielectric characteristics. In other words, a device circuit undergoes energy losses in the transmission process, which are called dielectric losses. The energy losses are not preferable because they are consumed as thermal energy in the device circuit, and discharged in the form of heat. In a low-frequency region the energy losses occur due to a dipole field change caused by dielectric polarization, and in a high-frequency region they occur due to ionic polarization and electronic polarization. The ratio between the energy consumed in a dielectric material and the energy built up in the dielectric material per cycle of an alternating field is referred to as a dielectric loss tangent, represented by $\tan \delta$. A dielectric loss is proportional to the product of a relative dielectric constant $\in$ and the dielectric loss tangent of material. Consequently, $\tan \delta$ increases with increasing frequency in the high-frequency region. In addition, the quantity of heat generated per unit area increases due to the high-density packing of electronic elements. To reduce the dielectric loss of a dielectric material as much as possible, therefore, it is required to use a material having a small value for $\tan \delta$. By use of a low-dielectric polymeric material having a reduced dielectric loss, the dielectric loss and the generation of heat due to electrical resistance are reduced so that the risk of signal malfunctions can be reduced. Materials having reduced transmission losses (energy losses) are thus strongly desired in the field of high-frequency communications. For materials electrically characterized by electrical insulation and a low-dielectric constant, it has been proposed so far in the art to use a diversity of materials such as thermoplastic resins, e.g., polyolefin, vinyl chloride resin and fluorine base resin, and thermosetting resins, e.g., unsaturated polyester resin, polyimide resin, epoxy resin, vinyltriazine resin (BT resin), crosslinkable polyphenylene oxide, and curable polyphenylene ether.

When materials having a low-dielectric constant are used as an electronic part (element) material, however, polyolefins such as polyethylene and polypropylene, like those set forth in JP-B 52-31272, have a grave disadvantage that their heat resistance is low although they have excellent insulation resistance as electrical properties. This is because they have a covalent bond such as a C—C bond, and are free of a large polar group. For this reason, their electrical properties (dielectric loss, dielectric constant, etc.) become worse when they are used at high temperatures. Thus, such polyolefins are not preferable for use as an insulating film (layer) for capacitors, etc. The polyethylene and polypropylene, once they have been formed into film, are coated and bonded onto a conductive material using an adhesive agent. However, this method does not only involve a complicated process but also offers some problems in view of coating, for instance, because it is very difficult to make the thickness of the film thin.

The vinyl chloride resin has high insulation resistance and excellent chemical resistance and fire retardance, but it has the demerits of lacking heat resistance as in the case of polyolefins, and having large dielectric losses as well.

Polymers containing a fluorine atom in their molecular chains, like vinylidene fluoride resin, trifluoroethylene resin, and perfluoroethylene resin, are excellent in terms of electrical properties (low dielectric constant, low-dielectric loss), heat resistance and chemical stability. However, one difficulty with such polymers is that, unlike thermoplastic resins, they cannot be heat-treated into formed articles or films due to their poor formability, and their poor ability to form coatings. Another disadvantage is that some added cost is needed for forming the polymers into devices. Yet another disadvantage is that the field to which the polymers are applicable is limited due to their low transparency. Such low-dielectric polymeric materials for general purpose use as mentioned above are all insufficient in terms of heat resistance because their allowable maximum temperature is below 130° C. and, hence, they are classified as an insulating material for electrical equipment into heat resistance class B or lower according to JIS-C4003.

On the other hand, the thermosetting resins such as epoxy resin, polyphenylene ether (PPE), unsaturated polyester resin, and phenolic resin are mentioned for resins having relatively good heat resistance. As disclosed in JP-A 6-192392, the epoxy resin conforms to performance requirements regarding insulation resistance, dielectric breakdown strength, and heat-resistant temperature. However, no satisfactory properties are obtained because of a relatively high dielectric constant of 3 or greater. The epoxy resin has another demerit of being poor in the ability to form thin films. In addition, a curable modified PPO resin composition is known, which composition is obtained by blending polyphenylene oxide resin (PPO) with polyfunctional cyanic acid ester resins and other resins, and adding a radical polymerization initiator to the blend for preliminary reactions. However, this resin, too, fail to reduce the dielectric constant to a satisfactory level.

With a view to improving the epoxy resin having poor heat resistance, combinations of the epoxy resin with, for instance, phenol-novolak resin, and vinyltriazine resin have been under investigation. However, a grave problem with these combinations is some significant drop of the dynamic properties of the resulting films.

For the purposes of solving the above problems while the electrical properties are maintained, and specifically introducing improvements in the processability on heating, and close contact with or adhesion to copper or other metal conductors (layers), proposals have been put forward for copolymers of branched cyclo-ring amorphous fluoropolymer, and perfluoroethylene monomer with other monomers. However, although these copolymers may satisfy electrical properties such as dielectric constant, and dielectric loss tangent, yet their heat resistance remains worse under the influence of a methylene chain present in the high-molecular main chain. Never until now, thus, is there obtained any resin that can come in close contact with device substrates.

Among performance requirements for a low-dielectric-constant material excellent in dielectric properties and insulation resistance, there is heat resistance. That is, such a material can stand up well to a 120-second heating at a temperature of at least 260° C. because a soldering step is always incorporated in a device fabrication process. Stated otherwise, the material should also be excellent in heat resistance, chemical stability such as alkali resistance, humidity resistance, and mechanical properties. Thus, the range of high-molecular materials capable of meeting such requirements is further limited. For instance, polyimide, polyether sulfone, polyphenylene sulfide, polysulfone, thermosetting polyphenylene ether (PPE), and polyethylene terephthalate are only known in the art. While these high-molecular materials are capable of forming thin films and coming in close contact with substrates, it is found that they are somewhat awkward. In a process of fabricating an insulating element film by, e.g., spin coating, the aforesaid high-molecular material is dissolved in an organic solvent to form a dilute solution. Then, the solution is spin coated, followed by evaporation of the solvent, yielding an insulating film. Solvents such as dimethylacetamide, and N-methylpyrrolidone that are good solvents for polyimide, and polysulfone are likely to remain partially in the insulating film because they are a polar yet high-boiling solvent and so have a low evaporation speed. It is also difficult to place the surface smoothness and consistency of thin films under control. Epoxy-modified polyphenylene ether resin or polyphenylene ether resin, too, is poor in workability and adhesion and, hence, reliability. In addition, much skill is required to form a uniform yet smooth film from a polymer solution because the polymer solution has a relatively high viscosity.

SUMMARY OF THE INVENTION

One object of the present invention is to provide a low-dielectric-constant polymeric material which has heat resistance, and is excellent in close contact with or adhesion to a metal conductor layer, capable of forming a thin film, low in terms of dielectric constant and dielectric loss, and excellent in insulating properties, and weather resistance and processability as well.

Another object of the invention is to provide a film which is obtained from the low-dielectric-constant polymeric material itself, and which has a low-dielectric constant, and is improved in terms of insulating properties, heat resistance, weather resistance, and processabilities such as formability. Yet another object of the invention is to provide a substrate which is obtained by lamination of two or more such films, and which has a low-dielectric constant and is improved in terms of insulating properties, heat resistance, weather resistance and processabilities such as formability. Still yet another object of the invention is to provide an electronic part which is obtained from the low-dielectric-constant polymeric material, and which is suitable for use in a high-frequency region. A further object of the invention is to provide a heat-resistant resin formed article improved in terms of heat resistance and formability.

Such objects are achieved by the inventions defined below as (1) to (14).

(1) A heat-resistant, low-dielectric polymeric material that is a resin composition comprising one or two or more resins having a weight-average absolute molecular weight of at least 1,000, wherein the sum of carbon atoms and hydrogen atoms in said composition is at least 99%, and some or all resin molecules have a chemical bond therebetween.

(2) The heat-resistant, low-dielectric polymeric material according to (1), wherein said chemical bond is at least one bond selected from crosslinking, block polymerization, and graft polymerization.

(3) The heat-resistant, low-dielectric polymeric material according to (1), wherein said resin composition is a copolymer in which a non-polar α-olefin base polymer segment and/or a non-polar conjugated diene base polymer segment are chemically combined with a vinyl aromatic polymer segment, and which shows a multi-phase structure wherein a dispersion phase formed by one segment is finely dispersed in a continuous phase formed by another segment.

(4) The heat-resistant, low-dielectric polymeric material according to (3), which is a copolymer with said α-olefin base polymer segment chemically combined with said vinyl aromatic polymer segment.

(5) The heat-resistant, low-dielectric polymeric material according to (3), wherein said vinyl aromatic polymer segment is a vinyl aromatic copolymer segment containing a monomer of divinylbenzene.

(6) The heat-resistant, low-dielectric polymeric material according to (4), which is a copolymer chemically bonded by graft polymerization.

(7) A heat-resistant, low-dielectric polymeric material, wherein a non-polar α-olefin base polymer containing a monomer of 4-methylpentene-1 is added to the resin composition according to (1).

(8) The heat-resistant, low-dielectric polymeric material according to (1), which is used in a high-frequency band of at least 1 MHz.

(9) A film of at least 50 μm in thickness, which is obtained using the heat-resistant, low-dielectric polymeric material according to (1).

(10) A substrate obtained by lamination of films, each according to (9).

(11) The film according to (9), which is used in a high-frequency band of at least 1 MHz.

(12) The substrate according to (10), which is used in a high-frequency band of at least 1 MHz.

(13) An electronic part, which is obtained using the heat-resistant, low-dielectric polymeric material according to (1) and used in a high-frequency band of at least 1 MHz.

(14) A heat-resistant resin article obtained by forming the heat-resistant, low-dielectric polymeric material according to (1) into a given shape.

EXPLANATION OF THE PREFERRED EMBODIMENTS

Figure 1:
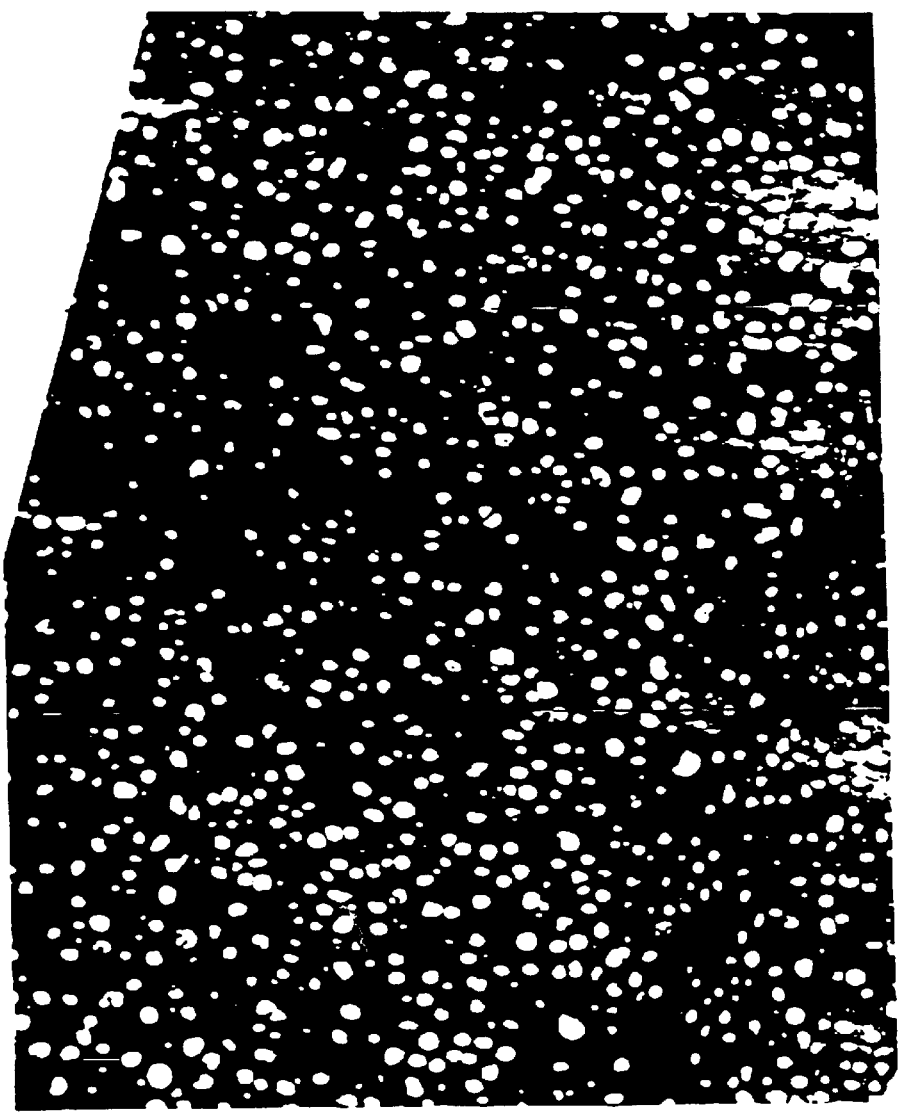
FIG. 1 is a TEM photograph of the graft copolymer according to the present invention.

The present invention will now be explained in great detail.

The heat-resistant, low-dielectric polymeric material of the invention is a resin composition comprising one or two or more resins having a weight-average absolute molecular weight of at least 1,000, wherein the sum of carbon atoms and hydrogen atoms in said composition is at least 99%, and some or all resin molecules have a chemical bond therebetween. The resin composition having such a weight-average absolute molecular weight, when used as a heat-resistant, low-dielectric polymeric material, ensures sufficient strength, sufficient close contact with or adhesion to metals, and sufficient heat resistance as well. A resin composition having a weight-average absolute molecular weight of lower than 1,000 is poor in mechanical physical properties, heat resistance, etc., and so is not suitable. The weight-average absolute molecular weight is more preferably 3,000 or greater, and even more preferably 5,000 or greater. Then, the upper limit to the weight-average absolute molecular weight is usually about 10,000,000 although not critical.

In the resin composition of the invention, the sum of the carbon atoms and hydrogen atoms should be at least 99% so as to convert existing chemical bonds into non-polar bonds, thereby ensuring that the resin composition, when used as a heat-resistant, low-dielectric polymeric material, has sufficient electrical properties. On the contrary, it is not preferable that the sum of carbon atoms and hydrogen atoms is less than 99%, and especially the number of polar molecule-forming atoms, e.g., oxygen atoms and nitrogen atoms, is larger than 1%. This is because electrical properties become insufficient, and especially the dielectric loss tangent becomes high.

Examples of the resin forming the aforesaid polymeric material are homopolymers and copolymers of non-polar α-olefins (hereinafter often referred to as (co)polymers) such as low-density polyethylene, ultra-low-density polyethylene, very-ultra-low-density polyethylene, high-density polyethylene, low-molecular-weight polyethylene, ultra-high-molecular-weight polyethylene, ethylene-propylene copolymer, polypropylene, polybutene, and poly(4-methylpentene), (co)polymers of monomers of conjugated dienes such as butadiene, isoprene, pentadiene, hexadiene, heptadiene, octadiene, phenylbutadiene, and diphenylbutadiene, and (co)polymers of monomers of carbon ring-containing vinyl such as styrene, nucleus-substituted styrene, e.g., methylstyrene, dimethylstyrene, ethylstyrene, isopropyl-styrene, and chlorostyrene, and α-substituted styrene, e.g., α-methystyrene, (α-ethylstyrene, divinylbenzene, and vinyl-cyclohexane.

Polymers consisting of units of one single non-polar α-olefin monomer, one single conjugated diene monomer, and one single carbon ring-containing vinyl monomer are mainly exemplified above. However, it is acceptable to use copolymers obtained from monomers of different chemical species, for instance, a non-polar αolefin monomer and a conjugated diene monomer, and a non-polar α-olefin monomer and a carbon ring-containing vinyl monomer.

Thus, the resin composition is comprised of these polymers, i.e., one or two or more resins. However, it is then required that some or all resin molecules be chemically bonded with each other. In other words, some resin molecules may be in a mixed state. Since at least some resin molecules are chemically bonded with each other, the resin composition, when used as a heat-resistant, low-dielectric polymeric material, ensures sufficient strength, sufficient close contact with or adhesion to metals, and sufficient heat resistance as well. However, the resin composition, when it is only in a mixed state and has no chemical bond, is insufficient in terms of heat resistance and mechanical physical properties.

Although not critical, the form of the chemical bond in the present invention may be a crosslinked structure, a block structure or a graft structure obtained by known methods. Preferred embodiments of graft, and block structures will be given later. For instance, it is desired that the cross-linked structure be obtained by heating preferably at a temperature of the order of 50 to 300° C. Crosslinking may also be achieved as by electron beam irradiation.

The presence or absence of the chemical bond according to the present invention may be identified by finding the degree of crosslinking, and graft efficiency, etc. in the case of the graft structure. This may also be confirmed by transmission electron microscope (TEM) photographs or scanning electron microscope (SEM) photographs. For instance, a TEM photograph taken of an $RuO_2$-stained super-thin fragment of the graft copolymer to be explained later in detail) that is a graft copolymer A in Example 9) is attached hereto as FIG. 1. From this photograph, it is found that one polymer segment, in the form of fine particles of approximately up to 10 μm, and more specifically 0.01 to 10 μm, is dispersed in another polymer segment. In a simple mixture (polymer blend), on the contrary, both the polymers have no compatibility with each other unlike a graft coplymer; that is, dispersed particles become large.

A first preferred embodiment of the resin composition of the invention is a thermoplastic resin that is a copolymer in which a non-polar α-olefin base segment is chemically combined with a vinyl aromatic polymer segment, and which shows a multi-phase structure in which a dispersion phase formed by one segment is finely dispersed in a continuous phase formed by another segment.

The non-polar α-olefin base polymer that is one segment in the thermoplastic resin showing such a specific multi-phase structure as explained above should be either a homopolymer of units of one single non-polar α-olefin monomer or a copolymer of two or more non-polar α-olefin monomers, obtainable by high-pressure radical polymerization, moderate- or low-pressure ion polymerization, etc. Copolymers with a polar vinyl monomer are not preferable because of a dielectric loss tangent increase. For instance, ethylene, propylene, butene-1, hexene-1, octene-1 and 4-methylpentene-1 are mentioned for the non-polar α-olefin monomer in the aforesaid polymer. Among others, ethylene, propylene, butene-1, and 4-methylpentene-1 are preferred because of providing a non-polar α-olefin base polymer having a low-dielectric constant.

Examples of the aforesaid non-polar α-olefin (co)polymer are low-density polyethylene, ultra-low-density polyethylene, very-ultra-low-density polyethylene, high-density polyethylene, low-molecular-weight polyethylene, ultra-high-molecular-weight polyethylene, ethylene-propylene copolymer, polypropylene, polybutene, and poly(4-methylpentene). These non-polar α-olefin (co)polymers may be used alone or in combination of two or more.

Such non-polar α-olefin (co)polymers have preferably a weight-average absolute molecular weight of at least 1,000. The upper limit to this molecular weight is about 10,000,000 although not critical.

The vinyl aromatic polymer that is one segment in the thermoplastic resin showing a specific multi-phase structure should be of non-polarity, and examples thereof are (co)polymers of monomers such as styrene, nucleus-substituted styrene, e.g., methylstyrene, dimethylstyrene, ethylstyrene, isopropylstyrene, and chlorostyrene, and αsubstituted styrene, e.g., α-methylstyrene, α-ethylstyrene, and o-, m-, and p-divinylbenzene (preferably m-divinylbenzene and p-divinylbenzene, and more preferably p-divinylbenzene). The use of the non-polar polymers is because the introduction of a monomer with a polar functional group by copolymerization is not preferable due to a dielectric loss tangent increase. The vinyl aromatic polymers may be used alone or in combination of two or more.

Among the vinyl aromatic copolymers, a vinyl aromatic copolymer containing a monomer of divinylbenzene is preferred because of a heat resistance improvement. Examples of the divinylbenzene-containing vinyl aromatic copolymer are copolymers of monomers such as styrene, nucleus-substituted styrene, e.g., methylstyrene, dimethylstyrene, ethylstyrene, isopropylstyrene and chlorostyrene, and α-substituted styrene, e.g., a-methylstyrene and α-ethylstyrene with a divinylbenzene monomer.

Although the ratio between the divinylbenzene monomer and the vinyl aromatic monomer other than the divinylbenzene monomer is not critical, it is preferred that the divinylbenzene monomer accounts for at least 1% by weight of the copolymer so as to satisfy heat resistance to solder. While it is acceptable that the divinylbenzene monomer accounts for 100% by weight of the copolymer, yet it is preferred that the upper limit to the divinylbenzene content is 90% by weight in view of a synthesis problem.

Preferably, the vinyl aromatic polymer that forms one segment in the invention has a weight-average absolute molecular weight of at least 1,000. While the upper limit thereto is not critical, it is usually about 10,000,000.

The thermoplastic resin having a specific multi-phase structure according to the present invention comprises 5 to 95% by weight, preferably 40 to 90% by weight, and most preferably 50 to 80% by weight of the olefin base polymer segment. Stated otherwise, the vinyl base polymer segment accounts for 95 to 5% by weight, preferably 60 to 10% by weight, and most preferably 50 to 20% by weight of the thermoplastic resin.

The thermoplastic resin having too low an olefin base polymer segment content is not preferable because the resultant formed article becomes brittle. Too much olefin base polymer segment is not again preferable because the close contact of the resin to metals becomes worse.

Such a thermoplastic resin has a weight-average absolute molecular weight of at least 1,000. Although the upper limit thereto is not critical, it is usually about 10,000,000 in view of formability.

Examples of the copolymer having a structure wherein the olefin base polymer segment and vinyl base polymer segment are chemically combined with each other are block copolymers, and graft copolymers, among which the graft copolymers are particularly preferred by reason of ease of preparation. Note that it is acceptable for these copolymers to include olefin base polymers and vinyl base polymers with the proviso that they do not deviate from the characteristic features of the block, and graft copolymers.

The thermoplastic resin having a specific multi-phase structure according to the present invention may be prepared by either chain transfer processes or ionizing radiation irradiation processes, all well known in the art. However, most preference is given to the following process for the reasons that high graft efficiency prevents the occurrence of secondary coalescence due to heat so that high performance is effectively obtainable, and that the process is simple in itself.

A detailed account will now be given on how to prepare the graft copolymer that is the thermoplastic resin showing a specific multi-phase structure according to the present invention. One hundred (100) parts by weight of an olefin base polymer are suspended in water. Apart from this, 5 to 400 parts by weight of a vinyl aromatic monomer are used to prepare a solution in which there are dissolved 0.1 to 10 parts by weight, per 100 parts by weight of the vinyl monomer, of one or a mixture of radically polymerizable organic peroxides represented by the following general formula (1) or (2) and 0.01 to 5 parts by weight, per a total of 100 parts by weight of the vinyl monomer and radically polymerizable organic peroxide, of a radical polymerization initiator that is decomposable at a temperature of 40 to 90° C. so as to obtain a half-life of 10 hours. The suspension, to which the solution is added, is heated under such conditions as to prevent substantial decomposition of the radical polymerization initiator, so that the olefin base polymer is impregnated with the vinyl monomer, radically polymerizable organic peroxide and radical polymerization initiator. Then, the temperature of the aqueous suspension is elevated for the copolymerization of the vinyl monomer and radically polymerizable organic peroxide in the olefin copolymer, thereby obtaining a grafting precursor.

Then, the grafting precursor is kneaded together in a molten state at 100 to 300° C., so that the graft copolymer of the invention can be obtained. By kneading a mixture of the grafting precursor with a separate olefin or vinyl base polymer in a molten state, too, the graft copolymer may be obtained. The most preferable graft copolymer is obtained by kneading together the grafting precursor.

General Formula (1)

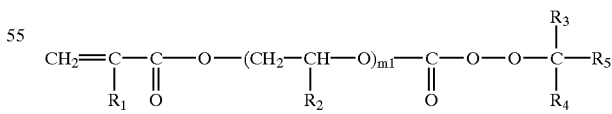

In general formula (1), $R_1$ is a hydrogen atom or an alkyl group having 1 to 2 carbon atoms, $R_2$ is a hydrogen atom or a methyl group, $R_3$ and $R_4$ are each an alkyl group having 1 to 4 carbon atoms, $R_5$ is an alkyl group having 1 to 12 carbon atoms, a phenyl group, an alkyl-substituted phenyl group or a cycloalkyl group having 3 to 12 carbon atoms, and $m_1$ is 1 or 2.

Gemera; Formula (2)

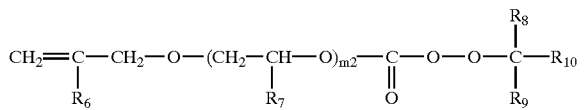

In general formula (2), $R_6$ is a hydrogen atom or an alkyl group having 1 to 4 carbon atoms, $R_7$ is a hydrogen atom or a methyl group, $R_8$ and $R_9$ are each an alkyl group having 1 to 4 carbon atoms, $R_{10}$ is an alkyl group having 1 to 12 carbon atoms, a phenyl group, an alkyl-substituted phenyl group or a cycloalkyl group having 3 to 12 carbon atoms, and $m_2$ is 0, 1 or 2.

Examples of the radically polymerizable organic peroxide represented by general formula (1) are t-butyl peroxyacryloyloxyethyl carbonate, t-amyl peroxyacryloyloxyethyl carbonate, t-hexyl peroxyacryloyloxyethyl carbonate, 1,1,3,3-tetramethylbutyl peroxyacryloyloxyethyl carbonate, cumyl peroxyacryloyloxyethyl carbonate, p-isopropylcumyl peroxyacryloyloxyethyl carbonate, t-butyl peroxymethacryloyloxyethyl carbonate, t-amyl peroxymethacryloyloxyethyl carbonate, t-hexyl peroxymethacryloyloxyethyl carbonate, 1,1,3,3-tetramethylbutyl peroxymethacryloyloxyethyl carbonate, cumyl peroxymethacryloyloxyethyl carbonate, p-isopropylcumyl peroxymethacryloyloxyethyl carbonate, t-butyl peroxymethacryloyloxyethyl carbonate, t-amyl peroxyacryloyloxyethyl carbonate, t-hexyl peroxyacryloyloxyethoxyethyl carbonate, 1,1,3,3-tetramethylbutyl peroxyacryloyloxyethoxyethyl carbonate, cumyl peroxyacryloyloxyethyoxyethyl carbonate, p-isopropylcumyl peroxyacryloyloxyethoxyethyl carbonate, t-butyl peroxymethacryloyloxyethoxyethyl carbonate, t-amyl peroxymethacryloyloxyethoxyethyl carbonate, t-hexyl peroxymethacryloyloxyethoxyethyl carbonate, 1,1,3,3-tetramethylbutyl peroxymethacryloyloxyethoxyethyl carbonate, cumyl peroxymethacryloyloxyethoxyethyl carbonate, p-isopropylcumyl peroxymethacryloyloxyethoxyethyl carbonate, t-butyl peroxyacryloyloxyisopropyl carbonate, t-amyl peroxyacryloyloxyisopropyl carbonate, t-hexyl peroxyacryloyloxyisopropyl carbonate, 1,1,3,3-tetramethylbutyl peroxyacryloyloxyisopropyl carbonate, cumyl peroxyacryloyloxyisopropyl carbonate, p-isopropylcumyl peroxyacryloyloxyisopropyl carbonate, t-butyl peroxymethacryloyloxyisopropyl carbonate, t-amyl peroxylmethacryloyloxyisopropyl carbonate, 1,1,3,3-tetramethylbutyl peroxymethacryloyloxyisopropyl carbonate, cumyl peroxymethacryloyloxyisopropyl carbonate, and p-isopropylcumyl peroxymethacryloyloxyisopropyl carbonate.

Exemplary compounds represented by general formula (2) are t-butyl peroxyallyl carbonate, t-amyl peroxyallyl carbonate, t-hexyl peroxyallyl carbonate, 1,1,3,3-tetramethylbutyl peroxyallyl carbonate, p-menthane peroxylallyl carbonate, cumyl peroxylallyl carbonate, t-butyl peroxyallyl carbonate, t-amyl peroxymethallyl carbnoate, t-hexyl peroxymethallyl carbonate, 1,1,3,3-tetramethylbutyl peroxymethallyl carbonate, p-menthane peroxymethallyl carbonate, cumyl peroxymethallyl carbonate, t-butyl peroxyallyloxyethyl carbonate, t-amyl peroxyallyloxyethyl carbonate, t-hexyl peroxyallyloxyethyl carbonate, t-butyl peroxymethallyloxyethyl carbonate, t-amyl peroxymethallyloxyethyl carbonate, t-hexyl peroxymethallyloxyethyl carbonate, t-butyl peroxyallyloxyisopropyl carbonate, t-amyl peroxyallyloxyisopropyl carbonate, t-hexyl peroxyallyloxyisopropyl carbonate, t-butyl peroxymethallyloxy- isopropyl carbonate, t-amyl peroxymethallyloxyisopropyl carbonate, and t-hexyl peroxymethallyloxyisopropyl cabonate.

Among others, preference is given to t-butyl peroxyacryloyloxyethyl carbonate, t-butyl peroxymethacryloyloxyethyl carbonate, t-butyl peroxyallyl carbonate, and t-butyl peroxymethallyl carbonate.

The graft efficiency of the thus obtained graft copolymer is 20 to 100% by weight. The graft efficiency may be determined from the per cent extraction by solvent of an ungrafted polymer.

The graft copolymer of the non-polar α-olefin base polymer segment with the vinyl aromatic polymer segment is preferred for the thermoplastic resin showing a specific multi-phase structure according to the present invention. For such a graft copolymer, however, it is acceptable to use a non-polar conjugated diene base polymer segment instead of or in addition to the non-polar α-olefin base polymer segment. The diene base polymers already mentioned may be used as this non-polar conjugated diene base polymer, and may be used alone or in combination of two or more.

It is to be noted that the non-polar α-olefin base polymer in the above graft copolymer may contain a conjugated diene monomer and the non-polar conjugated diene base polymer may contain an α-olefin monomer.

According to the present invention, it is also to be noted that the obtained graft copolymer may be crosslinked with divinylbenzene, etc. This is particularly preferable for a divinylbenzene monomer-free graft copolymer because its heat resistance is improved.

A block copolymer, too, may be used as the thermoplastic resin showing a specific multi-phase structure according to the present invention. For this block copolymer, for instance, a block copolymer of at least one polymer of a vinyl aromatic monomer with at least one polymer of a conjugated diene may be mentioned. The block copolymer may be of either a straight-chain type or a radial type wherein hard and soft segments are radially combined with each other. Also, the conjugated diene-containing polymer may be either a random copolymer with a small amount of a vinyl aromatic monomer or a so-called tapered block copolymer wherein the content of the vinyl aromatic monomer in one block increases gradually.

No particular limitation is imposed on the structure of the block copolymer; that is, the block copolymer may be any of $(A—B)_n$, $(A—B)_n—A$, and $(A, B)_n—C$ types wherein A is a polymer of the vinyl aromatic monomer, B is a polymer of the conjugated diene, C is a coupling agent residue, and n is an integer of 1 or greater. It is to be noted that a conjugated diene moiety in the block copolymer may be hydrogenated for use.

For such a block copolymer, it is acceptable to use the aforesaid non-polar α-olefin base polymer instead of or in addition to the aforesaid non-polar conjugated diene base polymer. In this case, the non-polar conjugated diene base polymer may contain an αolefin monomer and the non-polar α-olefin base polymer may contain a conjugated diene monomer. For the quantitative ratio between the segments in the block copolymer, and preferred embodiments thereof, reference is made to what is mentioned in connection with the graft copolymer.

To improve the heat resistance of the resin composition of the invention, and preferably the thermoplastic resin showing a specific multi-phase structure (and more preferably the graft copolymer), it is preferable to add thereto a non-polar αolefin base polymer including a monomer of 4-methylpentene-1. In some cases, the non-polar α-olefin base polymer including a monomer of 4-methylpentene-1 may be contained in the resin composition of the invention without making a chemical bond thereto. In such cases, such addition is not always required, but this is acceptable to obtain given properties.

In the present invention, it is preferable that the monomer of 4-methylpentene-1 accounts for at least 50% by weight of the non-polar α-olefin base copolymer. It is here to be noted that such a non-polar α-olefin base copolymer may further contain a conjugated diene monomer.

In particular, poly(4-methylpentene-1) that is a homopolymer consisting of units of one single monomer of 4-methylpentene-1 is preferable as the non-polar α-olefin base copolymer including the monomer of 4-methylpentene-1.

The poly(4-methylpentene-1) is preferably a crystalline poly(4-methylpentene-1) that is an isotactic poly(4-methylpentene-1) obtained by the polymerization of 4-methylpentene-1 which is a dimer of propylene, using a Ziegler-Natta catalyst, etc.

No particular limitation is placed on the ratio between poly(4-methylpentene-1) and the thermoplastic resin showing a specific multi-phase structure. To satisfy heat resistance and adhesion to metals, however, it is preferable to use poly(4-methylpentene-1) in an amount of 10 to 90% by weight. Too little poly(4-methylpentene-1) makes heat resistance to solder likely to become insufficient, and too much renders adhesion to metals likely to become insufficient. When the copolymer is used instead-of poly(4-methylpentene-1), it may be added in an amount within the aforesaid range.

The resin composition of the invention (to which the non-polar α-olefin base polymer containing the monomer of 4-methylpentene-1 may be added) has a softening point of 200 to 260° C. Sufficient heat resistance to solder may be obtained by making a suitable selection from such a range.

The heat-resistant, low-dielectric polymeric material of the invention may be obtained by processes wherein a resin material obtainable from the aforesaid resin composition is formed as by heat pressing into a thin film or other given shape. Alternatively, the resin material may be mixed with other thermoplastic resin in a molten state by means of roll mixers, Banbury mixers, kneaders, and single screw or twin-screw extruders, all having shear force, and the mixture may then be formed into any desired shape.

The resin material of the invention may be used in various forms inclusive of bulk or other given forms of formed articles or for film lamination purposes. Thus, the resin material of the invention may be used for various substrates for electronic equipment or parts (resonators, filters, capacitors, inductors, antennas, etc.) for high-frequency purposes, chip part forms of filters (e.g., C filters that are multilayer substrates) or resonators (e.g., tri-plate resonators), supports for dielectric resonators, housings or casings for various substrates or electronic parts (e.g., antenna rod housings), and electronic parts and their housings or casings.

In the field of substrates, the resin material of the invention is expected to be an alternative to glass, and epoxy substrates used so far in the art. More illustratively, the resin material may be applied to on-board substrates with parts mounted thereon, copper clad laminates, etc., and to substrates with built-in circuits, antenna substrates (patch antennas) as well. Also, the resin material of the invention may be applied to on-board substrates for CPUs, which require heat-radiating treatments and are designed for use in a high-frequency band of at least 100 MHz.

For instance, a multilayer substrate may be obtained by interleaving a metal conductor layer that is a conductor film of copper or other metal between films and/or laminating the conductor film on the outermost layer, and thermally fusing the laminate together. In this case, too, improved close contact with the metal conductor film is obtained. Each film is obtained as by forming with a thickness of at least 50 μm, and with a thickness of 100 to 1,000 μm for such purposes. In other words, the film includes a film having a thickness tantamount to a substrate. The copper foil preferably used as the metal conductor film has a thickness of 18 to 35 μm. The total thickness of the substrate inclusive of the multilayer type is usually of the order of 0.1 to 1.6 mm. Occasionally, however, the substrate may have a larger thickness, and may be used with a thickness of about 10.0 mm.

To form the metal conductor layer to a given pattern, it is acceptable that the metal conductor film is patterned to a given shape before close contact. However, when the metal conductor film is brought in close contact with an electrical insulating film by lamination, the metal conductor layer forming the outermost layer may be patterned, and then brought in close contact with the insulating film. Alternatively, the metal conductor layer may be etched out upon close contact with the insulating film, and then patterned.

The metal conductor layer may also be formed as by a vacuum deposition process.

In addition to the resin material, it is preferable to use a reinforcing filler material used so far for rigid substrates or the like, e.g., silica powders, alumina powders, and precipitating barium ($BaSO_4$) powders within a range undetrimental to the low-dielectric performance (low dielectric constant, and low-dielectric loss tangent) for the purposes of controlling heat conductivity and the coefficient of expansion, improving the deposition and close contact of copper or the like by plating, and achieving low prices. The reinforcing fillers may be used alone or in combination of two or more.

Preferably, the resin material accounts for 10 to 70% by weight of the reinforcing filler-containing film. This ensures a film or substrate having sufficient strength, low-dielectric performance, and heat resistance. Such a filler content is achievable by allowing the resin material to act as resin paste upon lamination of the film or substrate, i.e., the resin material to be by itself available in a heat-fusible amount (of at least 10% by weight).

The resin material of the invention may be formed into a given shape by molding, compression, and extrusion processes, already mentioned, as well as other suitable processes. That is, a suitable selection may be made from known processes depending on what purpose the resin material of the invention is used for. It is to be noted, however, that the chosen process should be able to form the resin material of the invention at low costs.

The heat-resistant, low-dielectric polymeric material provided by the resin material of the invention is preferably used in a high-frequency band of at least 1 MHz.

When the electrical performance of the heat-resistant, low-dielectric polymeric material of the invention is represented by a dielectric constant (∈) of at least 1, and especially 2.0 to 3.0, and a dielectric loss tangent (tan δ) of up to 0.01, and usually 0.001 to 0.01, as measured in a high-frequency band of at least 60 MHz, and especially 60 MHz to 10 GHz, there can be obtained a low-dielectric, electrical insulating material. By forming the polymeric material of the invention as a reinforcing filler-containing electrical insulating substrate that is an electrical element, it is also possible to improve substrate strength, make the coefficient of expansion lower than that of the low-dielectric, electrical insulating substrate per se, and improve heat conductivity.

It is here to be noted that the insulation resistivity of the polymeric material according to the present invention is at least 2 to $5\times10^{14}$ Ωcm, as represented by volume resistivity in a normal state. In addition, the polymeric material of the invention has a high dielectric breakdown strength of at least 15 KV/mm, and especially 18 to 30 KV/mm.

The polymeric material of the invention is excellent in heat resistance, and can stand up well to heating temperature applied for soldering. Thus, the polymeric material of the invention is preferably used not only for substrates and electronic parts, but also for housings and casings for which such treatments are needed.

EXAMPLE

The present invention will now be explained in further detail with reference to examples.

Example 1

One thousand (1,000) grams of polyethylene (made by Nippon Polyolefin Co., Ltd., and available under the trade name of G401) were blended with 10 grams of Percumyl D (the trade name of a product made by Nippon Fats and Oils Co., Ltd.). Then, the blend was extruded through a coaxial twin-screw extruder preset at a cylinder temperature of 140° C. and a screw diameter of 30 mm, and subsequently granulated to obtain a heat-crosslinkable polyethylene resin. The weight-average absolute molecular weight of the polyethylene was measured with a high-temperature GPC (made by Waters Co., Ltd.), and the carbon and hydrogen contents of the resin were determined by elemental analysis.

The resin particles were heat-pressed at 220° C. using a heat-pressing machine (made by Ueshima Machine Co., Ltd.) to prepare an electrical insulating material test piece of 10 cm×10 cm×0.1 cm. Apart from this, an injection molding machine was used to prepare test pieces of 13 mm×65 mm×6 mm as Izod impact test pieces and heat-resistance-to-solder test pieces. The obtained test pieces were used to make estimation of volume resistivity, dielectric breakdown strength, dielectric constant, dielectric loss tangent, heat resistance to solder, Izod impact strength, and adhesion to metal. Further, the obtained resin pellet was used for the measurement of water absorption. Furthermore, the polyethylene resin pressed and heat-crosslinked by the heat-pressing machine was pulverized, and heated in xylene to find the degree of crosslinking from its solubility. The testing methods used are described below.

Insulation resistance testing (volume resistivity): JIS K 6911 (at a testing voltage of 500 V).

Dielectric breakdown testing (dielectric breakdown strength): JIS C 2110.

Dielectric constant testing: according to JIS L 1094 B.

Dielectric loss tangent: according to ASTM D150.

For the estimation of heat resistance to solder, a test piece was immersed for 2 minutes in solder heated to 200° C., 230° C., and 260° C. to observe to what degree the test piece was deformed.

(Notched) Izod impact strength (referred to as Izod in the following tables, and expressed in kg·cm/cm² unit): JIS K7110.

For the estimation of adhesion to metal, a test piece was vacuum-deposited with aluminum, and then lightly rubbed with a cloth to investigate the adhesion of the thin film to metal.

Water absorption: according to ASTM D570.

For the estimation of the degree of crosslinking, 1 gram of pulverized resin was placed in 70 ml of xylene, heated to 120° C. under reflux, and stirred for 10 minutes. Thereafter, the solubility of the resin was observed.

For the estimation of formability, the moldability of an Izod impact test piece upon an injection molding machine and the formability thereof upon a pressing machine, and the moldability of film upon extrusion molding were investigated.

The results of each test are reported in Table 1 wherein the dielectric constant is given by electrostatic capacity of test piece as dielectric material/ electrostatic capacity of test piece in vacuum Regarding the heat resistance to solder, symbols ○, Δ, and × indicate "no deformation", "partial deformation", and "large deformation", respectively, and regarding the adhesion to metal, symbols ○, Δ, and × indicate "good", "partial peeling", and "total peeling", respectively.

Examples 2 to 4

Polyethylene having a weight-average absolute molecular weight of 1,000, 3,000, and 5,000 was hot-blended with Percumyl D as in Example 1. The obtained resin particles were formed and tested as in Example 1. The results are reported in Table 1.

Example 5

One thousand (1,000) grams of polypropylene (made by Nippon Polyolefin Co., Ltd., and available under the trade name of J Alloy 150G) were added thereto with 10 grams of divinylbenzene and 0.5 grams of Percumyl D (the trade name of the product made by Nippon Fats and Oils Co., Ltd.). The blend was extruded through a co-axial twin-screw extruder preset at a cylinder temperature of 170° C. and a screw diameter of 30 mm, and then granulated to obtain a heat-crosslinkable polypropylene resin. The resin was formed and estimated as in Example 1. The results are reported in Table 1.

TABLE 1

| Example | 1 | 2 | 3 | 4 | 5 |
|---|---|---|---|---|---|
| Resin | PE | PE | PE | PE | PP |
| Ratio in the sum of atoms between carbon atoms and hydrogen atoms (%) | >99 | >99 | >99 | >99 | >99 |
| Molecular weight (Mw) | 171000 | 1000 | 3000 | 5000 | 300000 |
| Volume resistivity (×10¹⁶ Ω · cm) | 3.0 | 3.0 | 3.0 | 3.0 | 3.0 |

TABLE 1-continued

| Example | 1 | 2 | 3 | 4 | 5 |
|---|---|---|---|---|---|
| Dielectric breakdown strength (KV/mm) | 20 | 20 | 22 | 22 | 20 |
| Dielectric constant 1 GHz | 2.10 | 2.06 | 2.08 | 2.10 | 2.10 |
| Dielectric constant 2 GHz | | | | | 2.12 |
| Dielectric constant 5 GHz | 2.08 | 2.08 | 2.06 | 2.08 | 2.25 |
| Dielectric constant 10 GHz | | | | | 2.25 |
| Dielectric loss Tangent ($\times 10^{-3}$) 1 GHz | 2.40 | 2.38 | 2.33 | 2.30 | 0.96 |
| Dielectric loss Tangent ($\times 10^{-3}$) 2 GHz | | | | | 0.16 |
| Dielectric loss Tangent ($\times 10^{-3}$) 5 GHz | 2.53 | 2.72 | 2.20 | 2.21 | 0.23 |
| Dielectric loss Tangent ($\times 10^{-3}$) 10 GHz | | | | | 0.29 |
| Heat resistance to solder 200° C. | ○ | Δ | Δ | ○ | ○ |
| Heat resistance to solder 230° C. | Δ | X | Δ | ○ | ○ |
| Heat resistance to solder 260° C. | X | X | X | X | Δ |
| Izod impact strength (Kg · cm/cm$^2$) | NB | NB | NB | NB | 9 |
| Adhesion to metal | Δ | Δ | Δ | Δ | Δ |
| Water absorption (%) | <0.03 | <0.03 | <0.03 | <0.03 | <0.03 |
| Formability | good | good | good | good | good |
| Degree of crosslinking (solubility) | IS | IS | IS | IS | IS |

NB: No breakdown
IS: Insoluble

Examples 6 and 7

Polyethylene (made by Nippon Polyolefin Co., Ltd., and available under the trade name of G401), polystyrene (made by Mitsubishi Monsanto Co., Ltd., and available under the trade name of Dialex HF77) and divinylbenzene at 70:29:1, and 50:49:1 (% by weight) were kneaded together in a molten state. The obtained resins were formed and estimated as in Example 1. The results are reported in Table 2.

Example 8

Two thousand (2,000) grams of pure water were placed in a stainless autoclave of 5 liters in volume, and 2.5 grams of polyvinyl alcohol as a suspending agent were dissolved in the water. Nine hundred and ninety (990) grams of a styrene monomer, 10 grams of divinylbenzene and 5 grams of a polymerization initiator benzoyl peroxide were charged and stirred in the solution. The autoclave was then heated to a temperature of 80 to 85° C., at which the solution was held for 7 hours to bring polymerization to completion. After filtration, water washing and drying gave a styrene-divinylbenzene copolymer. The resin was formed and estimated as in Example 1. The results are reported in Table 2.

TABLE 2

| Example | 6 | 7 | 8 |
|---|---|---|---|
| Resin | PE/PS/DVB | PE/PS/DVB | St/DVB |
| (% by weight) | (70:29:1) | (50:49:1) | (99:1) |
| Ratio in the sum of atoms between carbon atoms and hydrogen atoms (%) | >99 | >99 | >99 |
| Molecular weight (Mw) | 171000/146000 | 171000/146000 | unmeasurable |
| Volume resistivity ($\times 10^{16}$ Ω · cm) | 3.0 | 3.0 | 3.0 |
| Dielectric breakdown strength (KV/mm) | 20 | 20 | 22 |
| Dielectric constant 1 GHz | 2.37 | 2.44 | 2.59 |
| Dielectric constant 2 GHz | 2.36 | 2.41 | 2.66 |
| Dielectric constant 5 GHz | 2.33 | 2.43 | 2.58 |
| Dielectric constant 10 GHz | 2.22 | 2.35 | 2.44 |
| Dielectric loss Tangent ($\times 10^{-3}$) 1 GHz | 0.53 | 0.60 | 0.45 |
| Dielectric loss Tangent ($\times 10^{-3}$) 2 GHz | 0.57 | 0.59 | 0.50 |
| Dielectric loss Tangent ($\times 10^{-3}$) 5 GHz | 0.62 | 0.66 | 0.58 |
| Dielectric loss Tangent ($\times 10^{-3}$) 10 GHz | 0.71 | 0.68 | 0.63 |
| Heat resistance to solder 200° C. | ○ | ○ | ○ |
| Heat resistance to solder 230° C. | ○ | Δ | ○ |
| Heat resistance to solder 260° C. | Δ | Δ | ○ |
| Izod impact strength (Kg · cm/cm$^2$) | 12 | 8 | 1 |
| Adhesion to metal | ○ | ○ | ○ |
| Water absorption (%) | <0.03 | <0.03 | <0.03 |
| Formability | good | good | good |
| Degree of crosslinking (solubility) | IS | IS | IS |

IS: Insoluble

Example 9

Two thousand and five hundred (2,500) grams of pure water were placed in a stainless autoclave of 5 liters in volume, and 2.5 grams of polyvinyl alcohol as a suspending agent were dissolved in the water. Seven hundred (700) grams of polypropylene (made by Nippon Polyolefin Co., Ltd., and available under the trade name of J Alloy 150G) as an olefin base polymer were placed and dispersed in the solution under agitation. Apart from this, 1.5 grams of benzoyl peroxide as a radical polymerization initiator and 9 grams of t-butyl peroxymethacryloyloxyethyl carbonate as a radically polymerizable organic peroxide were dissolved in 300 grams of styrene as a vinyl aromatic monomer. The solution was then charged and stirred in the autoclave.

Subsequently, the autoclave was heated to a temperature of 60 to 65° C., at which the solution was stirred for 2 hours to impregnate the radical polymerization initiator and radically polymerizable organic peroxide-containing vinyl monomer into the polypropylene. Then, the temperature was brought up to 80 to 85° C., at which the solution was maintained for 7 hours to bring polymerization to completion. After filtration, water washing and drying yielded a grafting precursor (a).

Then, this grafting precursor (a) was extruded at 200° C. through a lab plastomill single screw extruder (made by Toyo Seiki Seisakusho Co., Ltd.) for a grafting reaction, thereby obtaining a graft copolymer (A).

Analysis of graft copolymer (A) by pyrolysis gas chromatography indicated that the weight ratio between polypropylene and styrene is 70:30.

At this time, the graft efficiency of the styrene polymer segment was 50.1% by weight. The graft efficiency was found by the ratio between the grafted styrene copolymer and the ungrafted styrene polymer extracted with ethyl acetate using a Soxhlet extractor.

The thermoplastic resin obtained in Example 9 was formed and tested as in Example 1. The results are reported in Table 3.

Examples 10 to 18

Graft copolymers (B) to (J) were obtained as in Example 9. The compositions of graft polymers upon charging, and the results of analysis of compositions by pylolysis gas chromatography are shown in Tables 3 and 4, wherein the results of tests are also reported. Abbreviations in these tables refer to:

PP: polypropylene J Alloy 150G (the trade name of a polypropylene product made by Nippon Polyolefin Co., Ltd.);

PE: polyethylene G401 (the trade name of a polyethylene product made by Nippon Polyolefin Co., Ltd.);

St: styrene;

DMS: dimethylstyrene; and

MSt: methylstyrene.

TABLE 3

| Example | 9 | 10 | 11 | 12 | 13 |
|---|---|---|---|---|---|
| Graft copolymer | A | B | C | D | E |
| Compositions upon charging (% by weight) | PP:St 70:30 | PP:St 50:50 | PP:St 5:95 | PP:St 95:5 | PE:DMS 70:30 |
| Results of analysis of compositions (% by weight) | PP:St 70:30 | PP:St 50:50 | PP:St 5:90 | PP:St 95:5 | PE:DMS |
| Ratio in the sum of atoms between carbon atoms and hydrogen atoms (%) | >99 | >99 | >99 | >99 | >99 |
| Volume resistivity ($\times 10^{16}$ Ω · cm) | 3.1 | 3.0 | 2.9 | 3.5 | 3.0 |
| Dielectric breakdown strength (KV/mm) | 22 | 20 | 19 | 22 | 19 |
| Dielectric constant 1 GHz | 2.27 | 2.25 | 2.40 | 2.15 | 2.30 |
| Dielectric constant 2 GHz | 2.30 | 2.25 | 2.43 | 2.12 | |
| Dielectric constant 5 GHz | 2.30 | 2.17 | 2.38 | 2.25 | 2.35 |
| Dielectric constant 10 GHz | 2.26 | 2.11 | 2.22 | 2.13 | |
| Dielectric loss Tangent ($\times 10^{-3}$) 1 GHz | 0.84 | 1.55 | 0.18 | 0.91 | 2.20 |
| Dielectric loss Tangent ($\times 10^{-3}$) 2 GHz | 0.52 | 1.20 | 0.19 | 0.88 | |
| Dielectric loss Tangent ($\times 10^{-3}$) 5 GHz | 0.49 | 1.20 | 0.18 | 0.53 | 2.15 |
| Dielectric loss Tangent ($\times 10^{-3}$) 10 GHz | 0.48 | 1.22 | 0.22 | 0.55 | |
| Heat resistance to solder 200° C. | ○ | ○ | ○ | ○ | ○ |
| Heat resistance to solder 230° C. | ○ | ○ | ○ | ○ | ○ |
| Heat resistance to solder 260° C. | Δ | Δ | Δ | Δ | Δ |
| Izod impact strength (Kg · cm/cm$^2$) | 9 | 8 | 2 | 9 | NB |
| Adhesion to metal | ○ | ○ | ○ | Δ | ○ |
| Water absorption (%) | <0.03 | <0.03 | <0.04 | <0.03 | <0.03 |
| Formability | good | good | good | good | good |
| Degree of crosslinking (solubility) | SW | SW | SW | SW | SW |

NB: no breakdown
SW: swelling

TABLE 4

| Example | 14 | 15 | 16 | 17 | 18 |
|---|---|---|---|---|---|
| Graft copolymer | F | G | H | I | J |
| Compositions upon charging (% by weight) | PP:PE:St 40:40:20 | PP:St:DMS 60:20:20 | PP:MSt 70:30 | PE:St 70:30 | PE:St 50:50 |
| Results of analysis of compositions (% by weight) | PP:PE:St 40:40:20 | PP:St:DMS 60:20:20 | PP:MSt 70:30 | PE:St 70:30 | PE:St 50:50 |
| Ratio in the sum of atoms between carbon atoms and hydrogen atoms (%) | >99 | >99 | >99 | >99 | >99 |
| Volume resistivity ($\times 10^{16}$ Ω · cm) | 3.1 | 3.0 | 2.9 | 3.5 | 3.0 |
| Dielectric breakdown strength (KV/mm) | 22 | 20 | 22 | 22 | 19 |
| Dielectric constant 1 GHz | 2.28 | 2.30 | 2.11 | 2.08 | 2.31 |
| Dielectric constant 2 GHz | | | | 2.07 | 2.34 |
| Dielectric constant 5 GHz | 2.09 | 2.22 | 2.10 | 2.01 | 2.27 |
| Dielectric constant 10 GHz | | | | 2.01 | 2.25 |
| Dielectric loss Tangent ($\times 10^{-3}$) 1 GHz | 2.10 | 2.18 | 1.95 | 0.98 | 1.29 |
| Dielectric loss Tangent ($\times 10^{-3}$) 2 GHz | | | | 0.40 | 1.07 |

TABLE 4-continued

| Example | 14 | 15 | 16 | 17 | 18 |
|---|---|---|---|---|---|
| Dielectric loss Tangent (×10$^{-3}$) 5 GHz | 2.27 | 2.23 | 2.13 | 0.47 | 1.06 |
| Dielectric loss Tangent (×10$^{-3}$) 10 GHz |  |  |  | 0.48 | 1.10 |
| Heat resistance to solder 200° C. | ○ | ○ | ○ | ○ | ○ |
| Heat resistance to solder 230° C. | ○ | ○ | ○ | ○ | ○ |
| Heat resistance to solder 260° C. | Δ | Δ | Δ | Δ | Δ |
| Izod impact strength (Kg · cm/cm$^2$) | 15 | 8 | 9 | NB | NB |
| Adhesion to metal | ○ | ○ | ○ | Δ | ○ |
| Water absorption (%) | <0.03 | <0.03 | <0.03 | <0.03 | <0.04 |
| Formability | good | good | good | good | good |
| Degree of crosslinking (solubility) | SW | SW | SW | SW | SW |

NB: no breakdown
SW: swelling

Example 19

Two thousand and five hundred (2,500) grams of pure water were placed in a stainless autoclave of 5 liters in volume, and 2.5 grams of polyvinyl alcohol as a suspending agent were dissolved in the water. Eight hundred (800) grams of polypropylene (made by Nippon Polyolefin Co., Ltd., and available under the trade name of J Alloy 150G) as an olefin base polymer were placed and dispersed in the solution under agitation. Apart from this, 1.5 grams of benzoyl peroxide as a radical polymerization initiator and 6 grams of t-butyl peroxymethacryloyloxyethyl carbonate as a radically polymerizable organic peroxide were dissolved in a mixed solution consisting of 100 grams of divinylbenzene and 100 grams of styrene as a vinyl aromatic monomer. The solution was then charged and stirred in the autoclave. Subsequently, the autoclave was heated to a temperature of 60 to 65° C., at which the solution was stirred for 2 hours to impregnate the radical polymerization initiator and radically polymerizable organic peroxide-containing vinyl monomer into the polypropylene. Then, the temperature was brought up to 80 to 85° C., at which the solution was maintained for 7 hours to bring polymerization to completion, followed by water washing and drying, thereby obtaining a grafting precursor (b).

Then, this grafting precursor (b) was extruded at 200° C. through a lab plastomill single screw extruder (made by Toyo Seiki Seisakusho Co., Ltd.) for a grafting reaction, thereby obtaining a graft copolymer (K).

Analysis of graft copolymer (K) by pyrolysis gas chromatography indicated that the weight ratio between polypropylene, divinylbenzene and styrene is 80:10:10.

At this time, the graft efficiency of the divinylbenzene-styrene copolymer was 50.1% by weight.

Graft copolymer (K) obtained herein, too, was tested as in Example 1. The results are reported in Table 5.

Examples 20 to 24

Graft copolymers (L) to (P) were obtained as in Example 19. The compositions of graft polymers upon charging, and the results of analysis of compositions by pyrolysis gas chromatography are shown in Table 5, wherein the results of tests are also reported. Abbreviations in the table refer to:

PP: polypropylene J Alloy 150G (the trade name of a polypropylene product made by Nippon Polyolefin Co., Ltd.);

PE: polyethylene G401 (the trade name of a polyethylene product made by Nippon Polyolefin Co., Ltd.);

DVB: divinylbenzene;

St: styrene; and

DMS: dimethylstyrene.

TABLE 5

| Example | 19 | 20 | 21 | 22 | 23 | 24 |
|---|---|---|---|---|---|---|
| Graft copolymer | K | L | M | N | O | P |
| Compositions upon charging (% by weight) | PP:DVB:St 80:10:10 | PP:DVB:St 50:1:49 | PP:DVB:St 5:10:85 | PP:DVB:St 95:4:1 | PE:DVB:DMS 70:5:25 | PP:DVB:St 70:10:20 |
| Results of analysis of compositions (% by weight) | PP:DVB:St 80:10:10 | PP:DVB:St 50:1:49 | PP:DVB:St 5:10:85 | PP:DVB:St 95:4:1 | PE:DVB:DMS 70:5:25 | PP:DVB:St 70:10:20 |
| Ratio in the sum of atoms between carbon atoms and hydrogen atoms (%) | >99 | >99 | >99 | >99 | >99 | >99 |
| Volume resistivity (×10$^{16}$ Ω · cm) | 3.0 | 3.1 | 2.9 | 3.5 | 2.5 | 3.0 |
| Dielectric breakdown strength (KV/mm) | 22 | 20 | 19 | 22 | 18 | 22 |
| Dielectric constant 1 GHz | 2.27 | 2.33 | 2.51 | 2.20 | 2.35 | 2.37 |
| Dielectric constant 2 GHz | 2.33 | 2.30 | 2.46 |  |  | 2.36 |
| Dielectric constant 5 GHz | 2.30 | 2.28 | 2.38 | 2.50 | 2.44 | 2.33 |
| Dielectric constant 10 GHz | 2.15 | 2.32 | 2.43 |  |  | 2.22 |
| Dielectric loss Tangent (×10$^{-3}$) 1 GHz | 0.59 | 0.95 | 0.67 | 0.87 | 2.65 | 0.53 |
| Dielectric loss Tangent (×10$^{-3}$) 2 GHz | 0.53 | 0.93 | 0.62 |  |  | 0.57 |
| Dielectric loss Tangent (×10$^{-3}$) 5 GHz | 0.68 | 0.87 | 0.60 | 0.68 | 2.82 | 0.62 |
| Dielectric loss Tangent (×10$^{-3}$) 10 GHz | 0.66 | 0.81 | 0.69 |  |  | 0.71 |
| Heat resistance to solder 200° C. | ○ | ○ | ○ | ○ | ○ | ○ |
| Heat resistance to solder 230° C. | ○ | ○ | ○ | ○ | ○ | ○ |
| Heat resistance to solder 260° C. | ○ | Δ | ○ | ○ | ○ | ○ |
| Izod impact strength (Kg · cm/cm$^2$) | 9 | 8 | 2 | 9 | NB | 9 |
| Adhesion to metal | ○ | ○ | ○ | Δ | ○ | ○ |

TABLE 5-continued

| Example | 19 | 20 | 21 | 22 | 23 | 24 |
|---|---|---|---|---|---|---|
| Water absorption (%) | <0.03 | <0.03 | <0.03 | <0.03 | <0.03 | <0.03 |
| Formability | good | good | good | good | good | good |
| Degree of crosslinking (solubility) | IS | IS | IS | IS | IS | IS |

NB: no breakdown
IS: Insoluble

Example 25

Two thousand and seven hundred (2,700) grams of poly (4-methylpentene-1) (made by Mitsui Petrochemical Industries, Ltd., and available under the trade name of TPX RT18 and 300 grams of graft copolymer (A) obtained in Example 1 were mixed together in a molten state. In this melt mixing, the resins were dry-blended together, then extruded through a co-axial twin-screw extruder preset at a cylinder temperature of 260° C. and a screw diameter of 30 mm, and finally granulated to obtain a resin (a).

Resin (a) obtained herein, too, was tested as in Example 1. The results are shown in Table 6.

Examples 26 to 34

Resins (b) to (j) were obtained as in Example 25. The types and ratios of poly(4-methylpentene-1) and graft copolymers blended are shown in Tables 6 and 7, in which the results of tests are also shown.

TABLE 6

| Example | 25 | 26 | 27 | 28 | 29 |
|---|---|---|---|---|---|
| Resin | a | b | c | d | e |
| Poly(4-methylpentene-1) (wt %) | 70 | 10 | 90 | 5 | 95 |
| Graft copolymer | A | B | E | A | A |
|  | 30 | 90 | 10 | 95 | 5 |
| Ratio in the sum of atoms between carbon atoms and hydrogen atoms (%) | >99 | >99 | >99 | >99 | >99 |
| Volume resistivity ($\times 10^{16}$ Ω · cm) | 3.1 | 3.0 | 3.1 | 3.1 | 3.0 |
| Dielectric breakdown strength (KV/mm) | 22 | 20 | 19 | 21 | 22 |
| Dielectric constant 1 GHz | 2.09 | 2.15 | 2.11 | 2.30 | 2.16 |
| Dielectric constant 2 GHz | 2.21 | 2.20 |  |  |  |
| Dielectric constant 5 GHz | 2.10 | 2.18 | 2.08 | 2.35 | 2.30 |
| Dielectric constant 10 GHz | 1.99 | 2.00 |  |  |  |
| Dielectric loss Tangent ($\times 10^{-3}$) 1 GHz | 0.63 | 0.73 | 0.93 | 0.88 | 0.66 |
| Dielectric loss Tangent ($\times 10^{-3}$) 2 GHz | 0.65 | 0.69 |  |  |  |
| Dielectric loss Tangent ($\times 10^{-3}$) 5 GHz | 0.61 | 0.63 | 1.08 | 0.63 | 0.72 |
| Dielectric loss Tangent ($\times 10^{-3}$) 10 Ghz | 0.57 | 0.55 |  |  |  |
| Heat resistance to solder 200° C. | ◯ | ◯ | ◯ | ◯ | ◯ |
| Heat resistance to solder 230° C. | ◯ | ◯ | ◯ | ◯ | ◯ |
| Heat resistance to solder 260° C. | ◯ | ◯ | ◯ | Δ | ◯ |
| Izod impact strength (Kg · cm/cm$^2$) | 4 | 7 | 2 | 8 | 2 |
| Adhesion to metal | ◯ | ◯ | ◯ | ◯ | Δ |
| Water absorption (%) | <0.02 | <0.02 | <0.02 | <0.02 | <0.02 |
| Formability | good | good | good | good | good |
| Degree of crosslinking (solubility) | IS | IS | IS | IS | IS |

IS: Insoluble

TABLE 7

| Example | 30 | 31 | 32 | 33 | 34 |
|---|---|---|---|---|---|
| Resin | f | g | h | i | j |
| Poly(4-methylpentene-1) (wt%) | 70 | 70 | 60 | 30 | 50 |
| Graft copolymer | K | I | A | A | A |
|  | 30 | 30 | 40 | 70 | 50 |
| Ratio in the sum of atoms between carbon atoms and hydrogen atoms (%) | >99 | >99 | >99 | >99 | >99 |
| Volume resistivity ($\times 10^{16}$ Ω · cm) | 3.0 | 3.0 | 3.0 | 3.1 |  |
| Dielectric breakdown strength (KV/mm) | 22 | 22 | 21 | 22 | 22 |
| Dielectric constant 1 GHz | 2.25 | 2.06 | 2.15 | 2.18 | 2.13 |
| Dielectric constant 2 GHz |  | 2.00 | 2.11 | 2.15 | 2.19 |
| Dielectric constant 5 GHz | 2.33 | 2.12 | 2.12 | 2.11 | 2.10 |
| Dielectric constant 10 GHz |  | 1.95 | 1.98 | 2.20 | 2.07 |
| Dielectric loss Tangent ($\times 10^{-3}$) 1 GHz | 0.57 | 0.62 | 0.65 | 0.59 | 0.58 |
| Dielectric loss Tangent ($\times 10^{-3}$) 2 GHz |  | 0.61 | 0.62 | 0.63 | 0.55 |

TABLE 7-continued

| Example | 30 | 31 | 32 | 33 | 34 |
|---|---|---|---|---|---|
| Dielectric loss Tangent ($\times 10^{-3}$) 5 GHz | 0.66 | 0.59 | 0.64 | 0.75 | 0.57 |
| Dielectric loss Tangent ($\times 10^{-3}$) 10 GHz | | 0.56 | 0.59 | 0.87 | 0.56 |
| Heat resistance to solder 200° C. | ○ | ○ | ○ | ○ | ○ |
| Heat resistance to solder 230° C. | ○ | ○ | ○ | ○ | ○ |
| Heat resistance to solder 260° C. | ○ | ○ | ○ | ○ | ○ |
| Izod impact strength (Kg · cm/cm²) | 4 | 4 | 5 | 8 | 7 |
| Adhesion to metal | ○ | ○ | ○ | ○ | ○ |
| Water absorption (%) | <0.02 | <0.02 | <0.02 | <0.02 | <0.02 |
| Formability | good | good | good | good | good |
| Degree of crosslinking (solubility) | IS | IS | IS | IS | IS |

IS: Insoluble

Examples 35 to 40

One (1) % by weight of divinylbenzene and 0.01% of Percumyl D (the trade name of a product made by Nippon Fats and Oils Co., Ltd.) were added to graft copolymer (A), (B), (C), (D), (E), and (I). These resins were formed and estimated as in Example 1. The results are shown in Table 8.

TABLE 8

| Example | 35 | 36 | 37 | 38 | 39 | 40 |
|---|---|---|---|---|---|---|
| Graft copolymer | A | B | C | D | E | I |
| Ratio in the sum of atoms between carbon atoms and hydrogen atoms (%) | >99 | >99 | >99 | >99 | >99 | >99 |
| Volume resistivity ($\times 10^{16}$ Ω · cm) | 3.1 | 3.0 | 2.9 | 3.5 | 3.0 | 3.1 |
| Dielectric breakdown strength (KV/mm) | 22 | 20 | 19 | 22 | 19 | 22 |
| Dielectric constant 1 GHz | 2.30 | 2.28 | 2.50 | 2.35 | 2.30 | 2.26 |
| Dielectric constant 2 GHz | | | | | | 2.15 |
| Dielectric constant 5 GHz | 2.25 | 2.20 | 2.58 | 2.26 | 2.40 | 2.18 |
| Dielectric constant 10 GHz | | | | | | 2.09 |
| Dielectric loss Tangent ($\times 10^{-3}$) 1 GHz | 0.78 | 1.60 | 1.20 | 1.80 | 2.25 | 0.75 |
| Dielectric loss Tangent ($\times 10^{-3}$) 2 GHz | | | | | | 0.70 |
| Dielectric loss Tangent ($\times 10^{-3}$) 5 GHz | 0.76 | 1.52 | 1.22 | 1.78 | 2.33 | 0.72 |
| Dielectric loss Tangent ($\times 10^{-3}$) 10 GHz | | | | | | 0.70 |
| Heat resistance to solder 200° C. | ○ | ○ | ○ | ○ | ○ | ○ |
| Heat resistance to solder 230° C. | ○ | ○ | ○ | ○ | ○ | ○ |
| Heat resistance to solder 260° C. | ○ | ○ | ○ | ○ | ○ | ○ |
| Izod impact strength (Kg · cm/cm²) | 9 | 8 | 2 | 9 | NB | 9 |
| Adhesion to metal | ○ | ○ | ○ | Δ | ○ | ○ |
| Water absorption (%) | <0.03 | <0.03 | <0.04 | <0.03 | <0.03 | <0.03 |
| Formability | good | good | good | good | good | good |
| Degree of crosslinking (solubility) | IS | IS | IS | IS | IS | IS |

NB: no breakdown
IS: Insoluble

Comparative Examples 1 to 4

Polypropylene J Alloy 150 G (the trade name of a polypropylene product made by Nippon Polyolefin Co., Ltd.), polyethylene G401 (the trade name of a polyethylene product made by Nippon Polyolefin Co., Ltd.), polystyrene Dialex HF77 (the trade name of a polystyrene product made by Mitsubishi Monsanto Co., Ltd.), and polypropylene and polystyrene at 70:30 (%:by weight) were mixed together in a molten state. The resins were formed and estimated as in Example 1. The results are shown in Table 9.

TABLE 9

| Comparative Example | 1 | 2 | 3 | 4 |
|---|---|---|---|---|
| Resin | PP | PE | PS | PP/PS |
| Mixing ratio | | | | 70:30 |
| Ratio in the sum of atoms between carbon atoms and hydrogen atoms (%) | >99 | >99 | >99 | >99 |
| Molecular weight (MW) | 300000 | 171000 | 146000 | 300000/146000 |
| Volume resistivity ($\times 10^{16}$ Ω · cm) | 3.0 | 3.0 | 3.0 | 3.0 |
| Dielectric breakdown strength (KV/mm) | 20 | 20 | 22 | 22 |
| Dielectric constant 1 Ghz | 2.10 | 2.09 | 2.45 | 2.31 |
| Dielectric constant 2 GHz | 2.12 | 2.10 | 2.53 | |
| Dielectric constant 5 GHz | 2.25 | 2.07 | 2.58 | |

TABLE 9-continued

| Comparative Example | 1 | 2 | 3 | 4 |
|---|---|---|---|---|
| Dielectric constant 10 GHz | 2.25 | 2.05 | | |
| Dielectric loss Tangent (×10$^{-3}$) 1 GHz | 0.96 | 0.65 | 0.15 | 0.34 |
| Dielectric loss Tangent (×10$^{-3}$) 2 GHz | 0.16 | 0.17 | 0.17 | |
| Dielectric loss Tangent (×10$^{-3}$) 5 GHz | 0.23 | 0.16 | 0.36 | |
| Dielectric loss Tangent (×10$^{-3}$) 10 GHz | 0.29 | 0.18 | | |
| Heat resistance to solder 200° C. | X | X | X | X |
| Heat resistance to solder 230° C. | X | X | X | X |
| Heat resistance to solder 260° C. | X | X | X | X |
| Izod impact strength (Kg · cm/cm$^2$) | 9 | NB | 2 | 5 |
| Adhesion to metal | X | X | ○ | Δ |
| Water absorption (%) | <0.03 | <0.03 | <0.03 | <0.03 |
| Formability | good | good | good | good |
| Degree of crosslinking (solubility) | soluble | soluble | soluble | soluble |

NB: no breakdown

Comparative Examples 5 to 9

Ethylene-ethyl acrylate copolymer (EEA) DPDJ9169 (the trade name of a copolymer product made by Nippon Unicar Co., Ltd.), ethylene-vinyl acetate copolymer (EVA) Ultracene 751 (the trade name of a copolymer product made by Toso Co., Ltd.), ethylene-glycidyl methacrylate copolymer (EGMA) RA3150 (the trade name of a copolymer product made by Nippon Polyolefin Co., Ltd.), polycarbonate (PC) Yupiron E2000 (the trade name of a polycarbonate product made by Mitsubishi Gas Chemical Company, Inc.), and polyphenylene oxide (PPO) Nolyl SE1 (the trade name of a polyphenylene oxide product made by GE Plastics Co., Ltd.) were used for the same estimation as in Example 1. The results are shown in Table 10.

obtain a heat crosslinkable polypropylene resin. This resin was formed and estimated as in Example 1. The results are shown in Table 10 wherein abbreviations refer to:

EEA: ethylene-ethyl acrylate copolymer;

EVA: ethylene-vinyl acetate copolymer;

EGMA: ethylene-glycidyl methacrylate copolymer;

PC: polycarbonate; and

PPO: polyphenylene oxide.

TABLE 10

| Comparative Example | 5 | 6 | 7 | 8 | 9 | 10 |
|---|---|---|---|---|---|---|
| Resin | EEA | EVA | EGMA | PC | PPO | PP wax |
| Ratio in the sum of atoms between carbon atoms and hydrogen atoms (%) | 98 | 97 | 98 | 91 | 94 | >99 |
| Molecular weight (MW) | 68000 | 36000 | 131000 | 34000 | not measured | 900 |
| Volume resistivity (×10$^{16}$ Ω · cm) | 1.0 | 1.0 | 1.0 | 2.0 | 10 | 3.0 |
| Dielectric breakdown strength (KV/mm) | 17 | 18 | 17 | 18 | 20 | 20 |
| Dielectric constant 1 GHz | 2.45 | 2.30 | 2.45 | 2.72 | 2.86 | 2.11 |
| Dielectric constant 2 GHz | 2.48 | 2.28 | 2.30 | 2.77 | 2.93 | 2.18 |
| Dielectric constant 5 GHz | 2.40 | 2.21 | 2.25 | 2.84 | 2.63 | 2.50 |
| Dielectric constant 10 GHz | | | | | | |
| Dielectric loss Tangent (×10$^{-3}$) 1 GHz | 32.82 | 21.01 | 25.59 | 6.01 | 4.40 | 0.86 |
| Dielectric loss Tangent (×10$^{-3}$) 2 GHz | 30.05 | 20.09 | 24.33 | 5.33 | 8.06 | 0.20 |
| Dielectric loss Tangent (×10$^{-3}$) 5 GHz | 28.37 | 21.27 | 21.30 | 2.07 | 5.74 | 0.22 |
| Dielectric loss Tangent (×10$^{-3}$) 10 GHz | | | | | | |
| Heat resistance to solder 200° C. | X | X | X | ○ | ○ | X |
| Heat resistance to solder 230° C. | X | X | X | ○ | ○ | X |
| Heat resistance to solder 260° C. | X | X | X | ○ | ○ | X |
| Izod impact strength (Kg · cm/cm$^2$) | NB | NB | NB | 75 | 20 | 2 |
| Adhesion to metal | ○ | ○ | ○ | ○ | ○ | X |
| Water absorption (%) | <0.03 | <0.03 | <0.03 | <0.20 | 0.07 | 0.03 |
| Formability | good | good | good | good | good | bad |
| Degree of crosslinking (solubility) | soluble | soluble | soluble | soluble | soluble | swelling |

NB: no breakdown

Comparative Example 10

Ten (10) grams of divinylbenzene and 0.5 grams of Percumyl D (the trade name of a product made by Nippon Fats and Oils Co., Ltd.) were added to 1,000 grams of PP wax having a weight-average absolute molecular weight of 900, which were in turn extruded through a co-axial twin-screw extruder preset at a cylinder temperature of 170° C. and a screw diameter of 30 mm, and then granulated to Comparative Examples 11 to 15

Graft copolymers (Q) to (U) were obtained as in Example 19. The compositions of graft copolymers upon charging, and the results of composition by pyrolysis gas chromatography are shown in Table 11, wherein the results of tests are also reported. Abbreviations in the table refer to:

PP: polypropylene;

PE: polyethylene;

PS: polystyrene;

EEA: ethylene-ethyl acrylate copolymer DPDJ 9169 (the trade name of a product made by Nippon Unicar Co., Ltd.);

EVA: ethylene-vinyl acetate copolymer Ultracene 751 (thetrade name of a product made by Toso Co., Ltd.);

EGMA: ethylene-glycidyl methacrylate copolymer RA3150 (the trade name of a product made by Nippon Polyolefin Co., Ltd.);

DVB: divinylstyrene;

St: styrene;

HEMA: hydroxypropyl methacrylate; and

AN: acrylonitrile.

Figure 2:
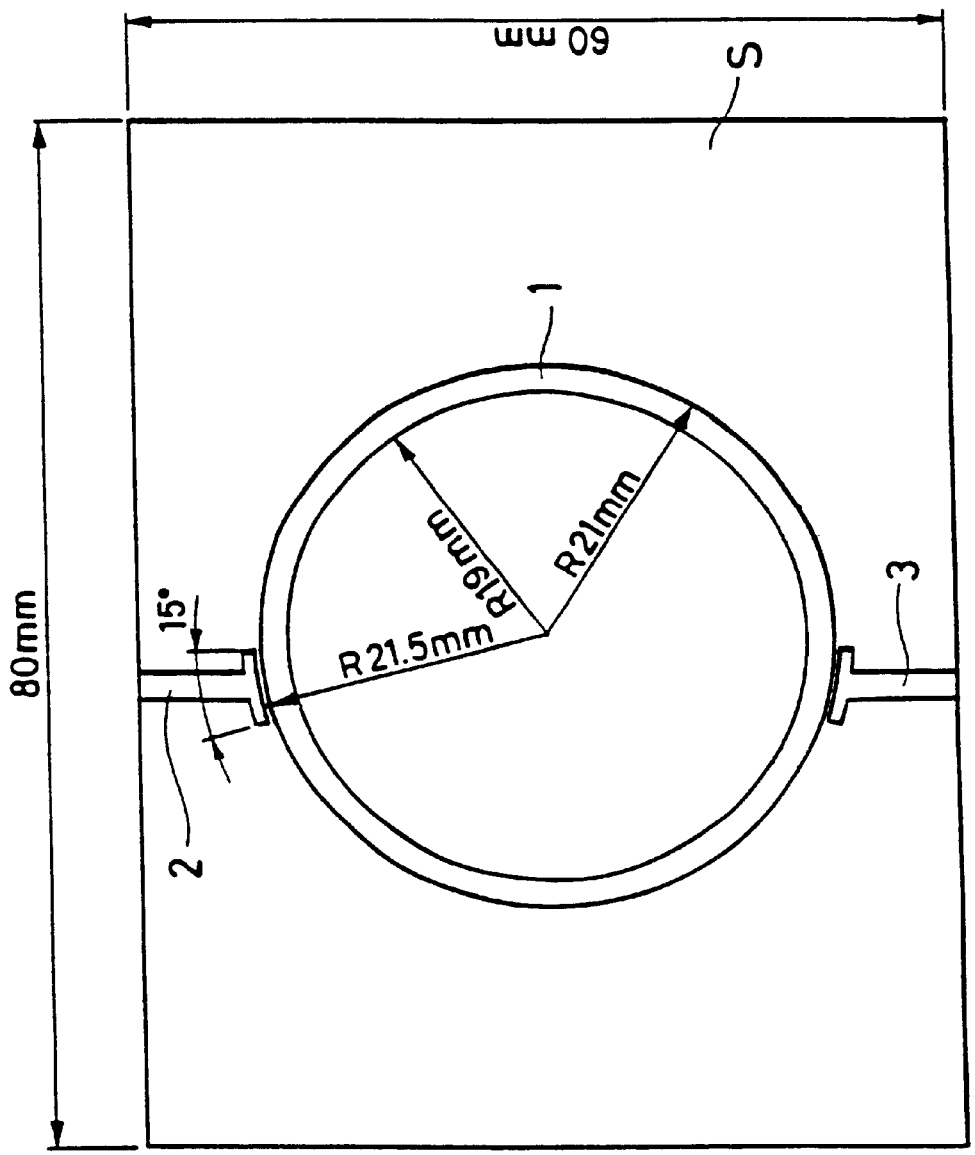
FIG. 2 is a general schematic of a ring resonator used for estimation of substrate's characteristics.
Figure 3:
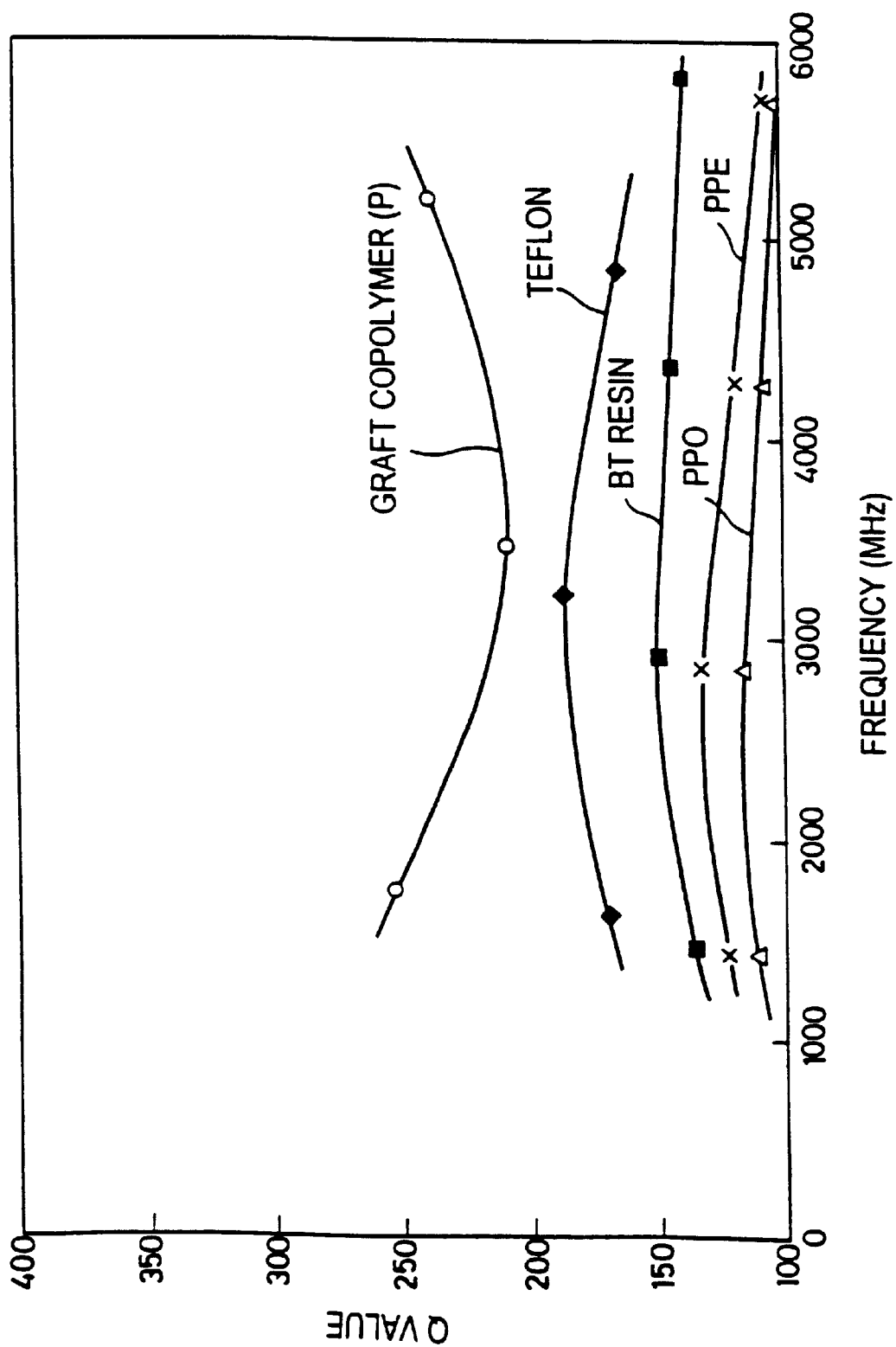
FIG. 3 is a graph illustrating a substrate's Q value vs. frequency relation.

Industry Co., Ltd.) were used to prepare substrates. Each of these substrates was etched on one side alone to mount a ring resonator 1 of 38 mm in (inner) diameter and 2 mm in width, an exciter electrode 2 and a detector electrode 3 in a substrate S, as depicted in FIG. 2. The amount of coupling between the ring resonator 1 and the exciter electrode 2 and detector electrode 3 was regulated such that the amount of attenuation at each resonance point was found to be −30 dB or greater by actual measurement of passing characteristics. To observe resonance at frequencies including harmonics, it is to be noted that the exciter electrode 2 and detector electrode 3 were located asymmetrically with respect to each other, as shown in FIG. 2. It is also to be noted that the exciter electrode 2 was spaced 21.5 mm away from the center of the ring resonator, and located with respect to a circular arc segment corresponding to 15 degrees of the ring resonator, as illustrated.

TABLE 11

| Comparative Example | 11 | 12 | 13 | 14 | 15 |
|---|---|---|---|---|---|
| Graft copolymer | Q | R | S | T | U |
| Composition upon charging (% by weight) | EEA:DVB:St 70:10:20 | PP:St:HEMA 60:20:20 | EVA:St 90:10 | EGMA:St 70:30 | PP:St:AN 50:35:15 |
| Results of analysis of composition (% by weight) | EEA:DVB:St 70:10:20 | PP:St:HEMA 60:20:20 | EVA:St 90:10 | EGMA:St 70:30 | PP:St:AN 50:35:15 |
| Ratio in the sum of atoms between carbon atoms and hydrogen atoms (%) | 98 | 98 | 97 | 98 | 96 |
| Volume resistivity (×$10^{16}$ Ω · cm) | 1.0 | 3.0 | 1.0 | 1.0 | 1.0 |
| Dielectric breakdown strength (KV/mm) | 19 | 22 | 18 | 19 | 18 |
| Dielectric constant 1 GHz | 2.45 | 2.52 | 2.20 | 2.44 | 2.36 |
| Dielectric constant 2 GHz | 2.40 | 2.31 | 2.25 | 2.53 | 2.26 |
| Dielectric constant 5 GHz | 2.33 | 2.25 | 2.40 | 2.40 | 2.39 |
| Dielectric constant 10 GHz | | | | | |
| Dielectric loss Tangent (×$10^{-3}$) 1 GHz | 30.82 | 7.55 | 7.02 | 25.49 | 1.42 |
| Dielectric loss Tangent (×$10^{-3}$) 2 GHz | 28.51 | 6.62 | 6.81 | 26.35 | 1.09 |
| Dielectric loss Tangent (×$10^{-3}$) 5 GHz | 26.33 | 7.02 | 5.95 | 25.58 | 1.21 |
| Dielectric loss Tangent (×$10^{-3}$) 10 GHz | | | | | |
| Heat resistance to solder 200° C. | ○ | ○ | X | Δ | ○ |
| Heat resistance to solder 230° C. | Δ | ○ | X | X | ○ |
| Heat resistance to solder 260° C. | X | X | X | X | X |
| Izod impact strength (Kg · cm/cm$^2$) | NB | 9 | NB | NB | 9 |
| Adhesion to metal | ○ | ○ | ○ | ○ | ○ |
| Water absorption (%) | 0.1 | 0.05 | 0.1 | 0.1 | 0.05 |
| Formability | good | good | good | good | good |
| Degree of crosslinking (solubility) | swelling | Insoluble | swelling | swelling | swelling |

NB: no breakdown

From the results in Tables 1 to 11, it is found that the resin materials of the invention are superior in performance to those according to the comparative examples. Resin materials departing from the scope of the invention regarding the number of carbon, and hydrogen atoms have a large dielectric loss tangent, and resin materials having no chemical bond between resin molecules or departing from the scope of the invention regarding molecular weight are poor in heat resistance, and insufficient in terms of close contact with metals, and strength as well.

Example 41

Graft copolymer (P) obtained in Example 24 of the invention was formed into a substrate of a given shape, and copper foils, each of 18 μm in thickness, were then thermally fused onto both sides of the substrate to obtain a double-sided copper-clad substrate of a thickness of t=0.8 mm, a length of 60 mm and a width of 80 mm). Teflon CGP500 (made by Chuko Kasei Kogyo Co., Ltd.), BT resin (vinyltriazine resin CCL-HL870 made by Mitsubishi Gas Chemical Company, Inc.), polyphenylene oxide PPO (R4726 made by Matsushita Electric Works, Ltd.), and polyphenylene ether PPE (CS3376 made by Asahi Chemical There is a minute difference in the dielectric constant between substrates, which gives rise to a slight difference in the energy radiated in the air therebetween. This is also true of the case where the substrates are actually used as circuit boards, etc. In the present invention, therefore, a Q value of a resonator substrate under no load, with such a difference included therein, was found.

For a measuring device, HP-8753D made by Hewlett-Packard Co. was used.

Q values of the substrates found at some frequencies are plotted in FIG. 2.

From FIG. 2, it is understood that the substrates using graft copolymer (P) of the invention have a higher Q value in a high-frequency band of 1 to 6 GHz.

The Cu tensile strength, etching resistance and coefficient of linear expansion α of graft copolymer (P) of the invention were also estimated. Consequently, the graft copolymer was found to be on satisfactory levels. As would be expected from the fact that the graft copolymer of the invention shows good close contact with an Al deposited film, it also showed good close contact with Cu.

Cu Tensile Peel Strength

For peeling testing, Cellotape was used to peel an external conductor copper foil from a test piece of 100 mm in length, 10 mm in width and 1.2 mm in thickness through 180 degrees. The test piece was rated as excellent when force of 2.0 kg/cm² or greater was required for peeling.

Etching Resistance

To make estimation of the state of a substrate sample, the sample was immersed in a 10 wt % solution of ferric chloride at 25° C. for 72 hours. The substrate sample was rated as excellent when it was free of blistering and showed no gloss degradation.

α

The coefficient of linear expansion was measured by a TMA method. A sample was rated as excellent when the coefficient of linear expansion was on a level of lower than 100 to 120 ppm/° C. in a temperature range of 20 to 200° C.

Example 42

Instead of graft copolymer (P), resin (a) obtained in Example 25 of the invention was estimated as in Example 41. Consequently, excellent results as in the case of the substrate using graft polymer (P) were obtained.

Example 43

A substrate was prepared following Examples 41 and 42 with the exception that a suitable reinforcing filler agent selected from alumina, crystalline silica, etc. was added to graft copolymer (P) in such an amount as to account for 35% by weight of the whole. The substrate was estimated as in Example 41. Consequently, similar excellent results were obtained. Further, it was found that some improvements are obtained in terms of α, Cu tensile peel strength, and heat conductivity. Furthermore, it was possible to reduce a to a level of 30 ppm/° C. or lower by increasing the amount of the reinforcing filler agent to 60 to 90% by weight.

Example 44

Figure 4:
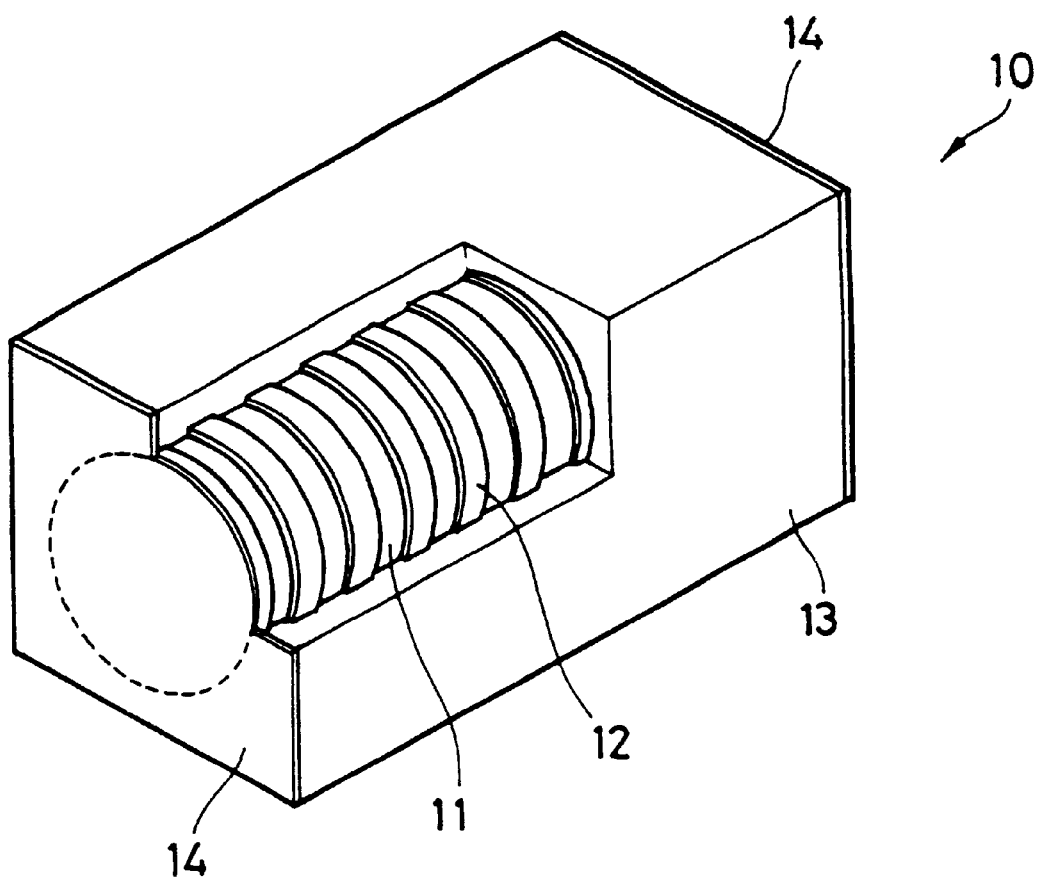
FIG. 4 is a general perspective view of a chip inductor.

Such a chip inductor as shown in FIG. 4 was prepared through the following steps.

1) Resin (a) obtained in Example 25 of the invention was extruded into a rod member of 1 mm in diameter and 20 cm in length.

2) A 20 $\mu$m-thick copper foil was coated on the above rod member by means of electroless plating, and electroplating.

3) The coated copper was removed in a helical form, using a laser processing machine. The remaining copper foil was 200 $\mu$m in width and 400 $\mu$m in pitch.

4) To protect the copper foil, two layers of resin were coated thereon in such a manner that an end face of the rod member was 1.2 mm square. Of the layers, resin (a) of the invention was used for the inner layer, and fumaric acid ester resin capable of being easily removed by use of a solvent (toluene, xylene or the like) was used for the outer layer. The size 1.2 mm square was that of the outer resin layer.

5) The above rod member was cut into a length of 2 mm.

6) The cut section was coated with copper by means of electroless plating to form an electrode thereon.

7) For removal of copper deposited on the sides, the resin layer used at 4) was removed with a solvent.

8) The end faces were provided thereon with electrodes by means of Ni—Cu plating.

Nickel or other plating applied to the electrodes applied on the end faces was omitted in this example.

As shown in FIG. 4, the thus obtained 2012 chip inductor, shown generally at 10, comprises a bobbin (rod member) 11 and a conductor (Cu foil) wound helically around the bobbin. This chip inductor is housed in a box form of housing member (resin) 13, with end electrodes 14 and 14 mounted on both its end faces.

The self-resonance frequency and coil Q factor of such a 2012 chip inductor were measured using HP-8753D made by Hewlett-Packard Co. Consequently, they were found to be on practical levels.

Example 45

Similar estimation was made following Example 44 with the exception that graft copolymer I obtained in Example 40 and further crosslinked with DVB was used in place of resin (a) of the invention. The results were equivalent to those obtained with resin (a) of the invention.

ADVANTAGES OF THE INVENTION

As detailed in the foregoing, the heat-resistant, low-dielectric polymeric material of the invention is low in terms of dielectric constant and dielectric loss tangent, excellent in heat resistance to solder, high in terms of processabilities such as formability and mechanical strength, and shows excellent adhesion to metals, etc. Thus, the polymeric material of the invention is especially useful for applications where electrical insulating properties, heat resistance to solder, and mechanical physical properties are needed, e.g., for printed wiring boards, and parts for computers, and can provide substrates or electronic parts having improved performance.

What is claimed is:

1. A heat-resistant, low-dielectric polymeric resin composition, comprising:

at least one resin having a weight-average absolute molecular weight of at least 1,000 and comprising a copolymer in which a non-polar α-olefin base polymer segment and/or a non-polar conjugated diene base polymer segment are chemically combined with a vinyl aromatic polymer segment, said copolymer having a multi-phase structure wherein a dispersion phase formed by one segment of said copolymer is finely dispersed in a continuous phase formed by another segment of said copolymer;

wherein the dispersion phase is in the form of particles ranging from 0.01 to 10 $\mu$m in size;

wherein the sum of the total number of carbon atoms and hydrogen atoms in said composition is at least 99% based on the total number of atoms in said composition;

wherein said composition has an effective amount of chemical bonds between resin molecules to render the composition insoluble or swellable in xylene; and wherein said chemical bonds are bonds obtained by crosslinking alone, or are a combination of bonds obtained by crosslinking and at least one bond obtained by block polymerization or graft polymerization.

2. The resin composition according to claim 1, which is a copolymer wherein an α-olefin base polymer segment is chemically combined with a vinyl aromatic polymer segment.

3. The resin composition according to claim 1, wherein said vinyl aromatic polymer segment is a copolymer of a vinyl aromatic monomer with a divinylbenzene monomer.

4. The resin composition according to claim 2, which is a copolymer chemically bonded by graft polymerization.

5. An electronic part manufactured from the resin composition according to claim 1, capable of being used in a high frequency band of at least 1 MHZ.

6. A film of at least 50 μm in thickness, obtained from the resin composition according to claim 1.

7. A laminate of at least two films, wherein each film is according to claim 6.

8. An electronic part manufactured from the film according to claim 6, capable of being used in a high-frequency band of at least 1 MHZ.

9. The laminate according to claim 7, capable of being used in a high-frequency band of at least 1 MHZ.

10. A shaped article manufactured from the resin composition according to claim 1.

11. The resin composition according to claim 1, wherein said non-polar α-olefin base polymer segment is selected from the group consisting of polyethylene, ethylene-propylene compolymer, polypropylene, polybutene, poly(4-methylpentene), and combinations thereof.

12. The resin composition according to claim 1, wherein said non-polar conjugated diene base polymer segment is selected from the group consisting of butadiene, isoprene, pentadiene, hexadiene, heptadiene, octadiene, phenylbutadiene, and diphenylbutadiene.

13. The resin composition according to claim 1, wherein said vinyl aromatic polymer segment is selected from the group consisting of styrene, methylstyrene, dimethylstyrene, ethylstyrene, isopropyl-styrene, and chlorostyrene, α-methystyrene, α-ethylstyrene, o-divinylbenzene, m-divinylbenzene, p-divinylbenzene, vinylcyclohexane, and combinations thereof.

14. The resin composition according to claim 1, wherein said non-polar α-olefin base polymer segment has a weight-average absolute molecular weight of at least 1000.

15. The resin composition according to claim 1, wherein said non-polar α-olefin base polymer segment has a weight-average absolute molecular weight of at least 1000 to 10,000,000.

16. The resin composition according to claim 1, wherein said vinyl aromatic polymer segment has a weight-average absolute molecular weight of at least 1000.

17. The resin composition according to claim 1, wherein said vinyl aromatic polymer segment has a weight-average absolute molecular weight of at least 1000 to 10,000,000.

18. The resin composition according to claim 1, wherein said non-polar α-olefin base polymer segment is present in said resin in an amount of 5 to 95% by weight, based on the weight of said resin.

19. The resin composition according to claim 1, wherein said non-polar α-olefin base polymer segment is present in said resin in an amount of 40 to 90% by weight, based on the weight of said resin.

20. The resin composition according to claim 1, wherein said vinyl aromatic polymer segment is present in said resin in an amount of 95 to 5% by weight, based on the weight of said resin.

21. The resin composition according to claim 1, wherein said vinyl aromatic polymer segment is present in said resin in an amount of 60 to 10% by weight, based on the weight of said resin.

* * * * *